(12) United States Patent
Ishihara et al.

(10) Patent No.: US 7,576,413 B2
(45) Date of Patent: Aug. 18, 2009

(54) PACKAGED STACKED SEMICONDUCTOR DEVICE AND METHOD FOR MANUFACTURING THE SAME

(75) Inventors: Masamichi Ishihara, Kitakyushu (JP); Akira Izumi, Kitakyushu (JP)

(73) Assignee: Kyushu Institute of Technology, Fukuoka (JP)

( * ) Notice: Subject to any disclaimer, the term of this patent is extended or adjusted under 35 U.S.C. 154(b) by 167 days.

(21) Appl. No.: 11/576,323

(22) PCT Filed: Nov. 29, 2005

(86) PCT No.: PCT/JP2005/021852

§ 371 (c)(1),
(2), (4) Date: Mar. 29, 2007

(87) PCT Pub. No.: WO2006/059589

PCT Pub. Date: Jun. 8, 2006

(65) Prior Publication Data

US 2008/0061402 A1    Mar. 13, 2008

(30) Foreign Application Priority Data

Nov. 30, 2004    (JP)    ............................. 2004-345274

(51) Int. Cl.
*H01L 29/40* (2006.01)
(52) U.S. Cl. .............................. 257/621; 257/E23.011; 438/638
(58) Field of Classification Search ........................ None
See application file for complete search history.

(56) References Cited

U.S. PATENT DOCUMENTS 6,607,970 B1 *  8/2003  Wakabayashi .............. 438/462
7,473,582 B2 *  1/2009  Wood et al. .................. 438/113
2002/0030245 A1  3/2002  Hanaoka et al.
2004/0212086 A1  10/2004  Dotta et al.
2005/0017338 A1 *  1/2005  Fukazawa ..................... 257/686
2005/0263869 A1 *  12/2005  Tanaka et al. ................ 257/686

(Continued)

FOREIGN PATENT DOCUMENTS

JP    10-223833    8/1998

(Continued)

*Primary Examiner*—Sue Purvis
*Assistant Examiner*—Benjamin P Sandvik
(74) *Attorney, Agent, or Firm*—McGlew and Tuttle, P.C.

(57) ABSTRACT

The present invention provides a packaged stacked semiconductor device which includes bumps serving as external electrode terminals, the bumps being provided on both a front surface and a back surface of the device, and which is sacked on another semiconductor device, substrate, or board having electrode terminals so that the bumps are directly and electrically connected to the electrode terminals. The semiconductor device includes a semiconductor substrate having through-electrodes formed therein. The semiconductor device has, on the front surface side of the semiconductor substrate, a wiring layer connected to the through-electrodes, an insulating film formed on the wiring layer, additional wiring formed on the insulating film, post electrodes connected to the wiring, and external connection bumps connected to the post electrodes. The semiconductor device has, on the back surface side of the semiconductor substrate, an insulating film formed so as to cover the back surface of the semiconductor substrate, exclusive of tip end portions of the through-electrodes, wiring which is formed on the insulating film and to which the through-electrodes are connected, and external connection bumps connected to the wiring.

24 Claims, 17 Drawing Sheets

CROSS-SECTIONAL VIEW OF STACKED SEMICONDUCTOR

U.S. PATENT DOCUMENTS

2006/0170112 A1 * 8/2006 Tanaka et al. ............... 257/777

FOREIGN PATENT DOCUMENTS

| JP | 2001-144213 | 5/2001 |
| JP | 2002-208655 | 7/2002 |
| JP | 2002-237468 | 8/2002 |
| JP | 2003-86591 | 3/2003 |
| JP | 2003-309221 | 10/2003 |
| JP | 2004-055439 | 2/2004 |
| JP | 2004-207416 | 7/2004 |
| JP | 2004-327910 | 11/2004 |

* cited by examiner

CROSS-SECTIONAL VIEW OF STACKED SEMICONDUCTOR

PROCESSED WAFER CROSS-SECTIONAL VIEW – I

THROUGH-ELECTRODE FORMATION
FROM HIGH-MELTING-POINT METAL
ON SUBSTRATE DURING WAFER PROCESSING

PROCESSED WAFER CROSS-SECTIONAL VIEW – II

THROUGH-ELECTRODE FORMATION
AFTER COMPLETION OF WAFER PROCESSING

FIG. 5
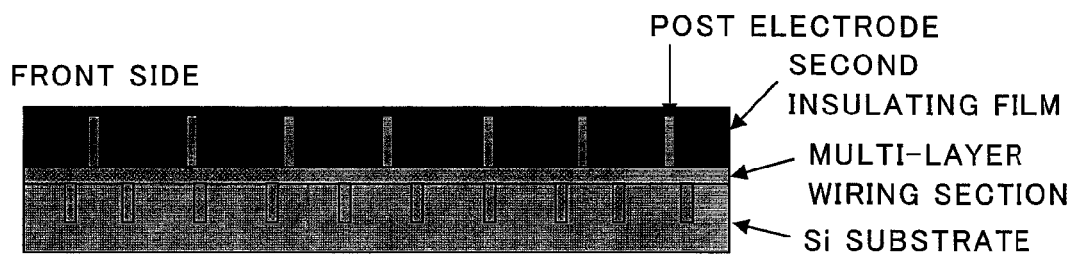
PLASTIC MOLDING
AFTER FORMATION OF ADDITIONAL WIRING
ON WAFER TOP SURFACE
AND FORMATION OF POST ELECTRODES
FIG. 6
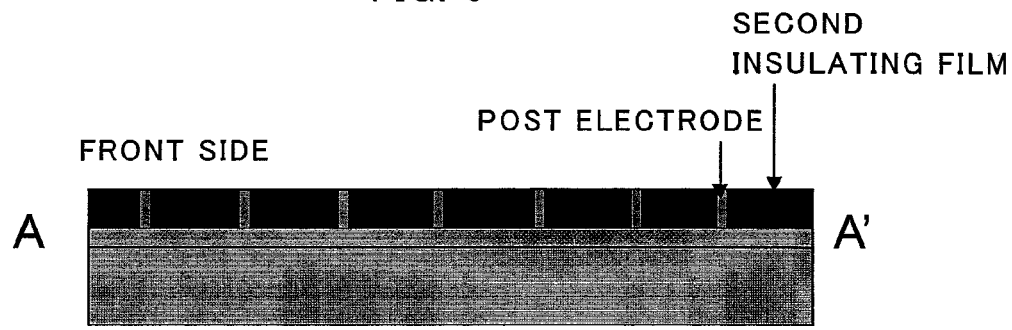
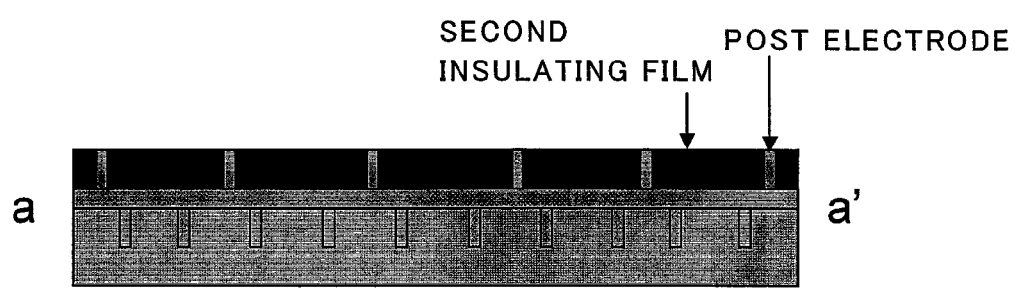
AFTER TOP SURFACE GRINDING
(UNTIL EXPOSURE OF POST ELECTRODES)
UPPER: A-A' CROSS SECTION,
LOWER: a-a' CROSS SECTION PROVISION OF BONDING PADS IN THE PERIPHERY OF CHIP
AFTER COMPLETION OF WAFER PROCESSING

PROVISION OF BONDING PADS IN INTERNAL AREA
AFTER ADDITIONAL WIRING

Si SELECTIVE ETCHING (WET ETCHING)
UNTIL EXPOSURE OF METAL POST ELECTRODES

INVERSION OF WAFER, AND APPLYING FILM FORMATION
ON Si SUBSTRATE TO HIDE METAL POST ELECTRODES

B-B' CROSS-SECTIONAL VIEW

ADDITIONAL WIRING ON WAFER BACK SURFACE

ARRANGEMENT AFTER FORMATION
OF BACK SURFACE ADDITIONAL WIRING

■ THROUGH-ELECTRODE

☐ PAD REGION AFTER FORMATION OF
BACK SURFACE ADDITIONAL WIRING

CASE WHERE BACK SURFACE ADDITIONAL WIRING
IS FORMED THROUGH INK JETTING BY USE OF
METAL NANOPARTICLES

FOURTH INSULATING FILM

C-C' CROSS SECTION

BACK SIDE

BUMP PAD REGION

C     C'

BUMP

PLAN VIEW OF
BACK SURFACE AFTER BUMP FORMATION

C     C'

D-D' CROSS SECTION

BUMP FORMATION ON FRONT AND BACK SURFACES

PLAN VIEW OF FRONT SURFACE
AFTER BUMP FORMATION

FIG. 20
DETAIL OF ANOTHER PROCESS FOR THROUGH-ELECTRODE FORMATION AFTER WAFER PROCESSING
(A)
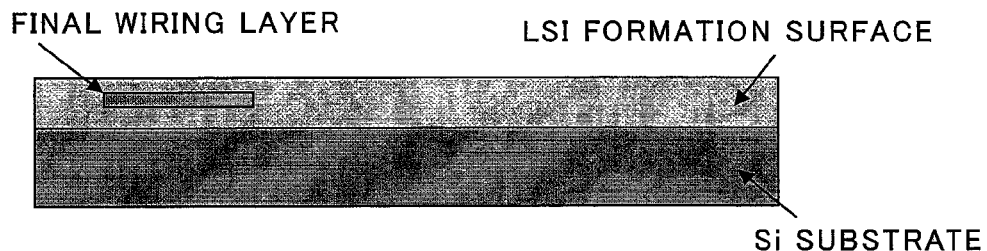
(B) INSULATING FILM FORMATION AFTER PROVISION OF HOLE
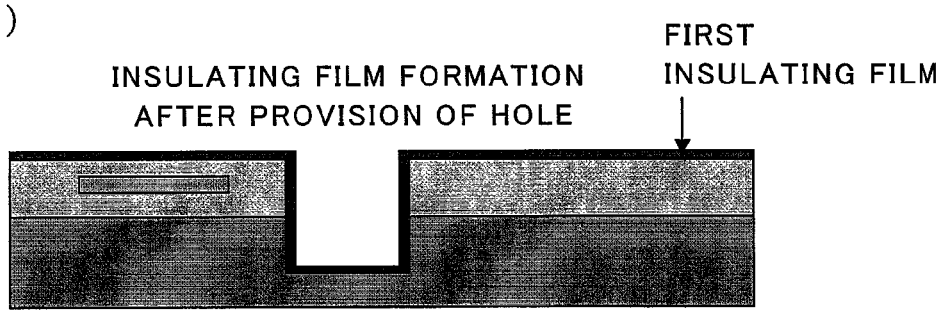
(C) FORMATION OF PORTION FOR CONNECTION WITH FINAL WIRING LAYER (APERTURE FORMATION THROUGH DIRECT LAZER IRRADIATION)
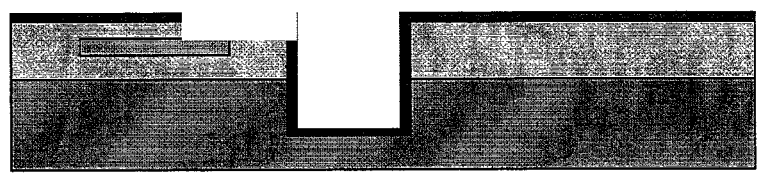
(D) SIMULTANEOUS FORMATION OF THROUGH-ELECTRODE AND WIRING (SQUEEGEEING OF METAL NANOPARTICLES)
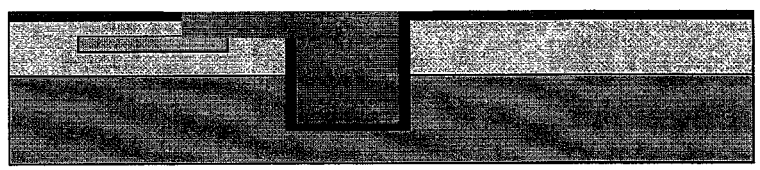

IN THE CASE WHERE THE SIZE OF UPPER LSI IS EQUAL TO
OR SMALLER THAN THAT OF LOWER LSI

CROSS-SECTIONAL VIEW

IN THE CASE WHERE THE SIZE OF UPPER LSI
IS GREATER THAN THAT OF LOWER LSI

PLAN VIEW

MOUNTING OF BATTERY AND INSERTION OF SUBSTRATE REQUIRED FOR CONNECTION

PACKAGED STACKED SEMICONDUCTOR DEVICE AND METHOD FOR MANUFACTURING THE SAME

TECHNICAL FIELD

The present invention relates to a semiconductor device which can be thinned and can be operated at higher speed, and to a method for producing the device. More particularly, the present invention relates to a packaged stacked semiconductor device including a plurality of successively stacked semiconductor devices, and to a method for producing the packaged stacked semiconductor device.

BACKGROUND ART

As highly integrated LSI chips have been developed, strong demand has arisen for a decrease in package size, and thus a variety of packaging structures have been proposed. In recent years, attempts have been made to develop a process for forming through-electrodes in semiconductor bare chips, and stacking the semiconductor bare chips. Meanwhile, there is a high likelihood of commercialization of a real-size packaged device having electrodes on its both surfaces. As a variety of multifunctional, small electronic apparatuses have been developed, a semiconductor device incorporated into such electronic apparatuses has been configured so as to include a number of circuit elements. Integration density of such a semiconductor device (integrated circuit device) can be increased by using a three-dimensional stacked semiconductor device.

However, conventional techniques do not disclose wiring on the back surface of a three-dimensional stacked semiconductor device (hereinafter such wiring may be referred to as "back wiring"). Back wiring on a device enables the device to be freely connected (stacked) on another component in three dimensions, and thus the device exhibits drastically increased degree of freedom in terms of combination.

Through-electrodes have conventionally been formed through a complicated high-cost process, and thus demand has arisen for a low-cost technique for forming through-electrodes. Conventionally, surfaces (walls) defining through-holes have been insulated through formation of a thermally oxidized film or through a CVD process. However, such a process requires high-temperature treatment, and thus is difficult to apply to a semiconductor device mounting process. Such a mounting process, in which insulation of through-hole-defining surfaces is carried out after LSI wiring, requires a process for insulating through-hole-defining surfaces at the lowest possible temperature. That is, there is still room for improvement in methods for forming through-holes in a semiconductor substrate and for insulating the through-holes.

Patent Documents 1 and 2, which are known publications, disclose only a method for forming a thermally oxidized film at low temperature.

Patent Document 3 and 4 disclose a technique for forming through-electrodes in semiconductor bare chips, and stacking the chips in three dimensions. However, each of the patent documents discloses only a structure whose rigidity is secured by merely a silicon substrate. Therefore, the structure requires a silicon substrate having a predetermined thickness (e.g., 50 µm or more), and thus requires deep through-holes, leading to difficulty in forming through-electrodes.

Patent Document 1: Japanese Patent Application Laid-Open (kokai) No. 2003-086591

Patent Document 2: Japanese Patent Application Laid-Open (kokai) No. 2002-237468

Patent Document 3: Japanese Patent Application Laid-Open (kokai) No. 2003-309221

Patent Document 4: Japanese Patent Application Laid-Open (kokai) No. H10-223833

DISCLOSURE OF THE INVENTION

Problems to be Solved by the Invention

As described above, conventional techniques do not disclose additional wiring on the back surface of a three-dimensional stacked semiconductor device; a method for forming through-holes in a semiconductor substrate and insulating the through-holes, the method being carried out at high temperature and thus applicable to a semiconductor device mounting process; and a technique for reducing the thickness of a silicon substrate for facilitating formation of through-electrodes.

In order to solve the aforementioned problems, the present invention contemplates provision of a packaged stacked semiconductor device which has undergone back wiring, which can be freely connected (stacked) on another component in three dimensions, and which exhibits drastically increased degree of freedom in terms of combination; as well as a method for producing the semiconductor device.

The present invention also contemplates insulation of surfaces defining through-holes at the lowest possible temperature, and as well formation of through-electrodes at low cost. Furthermore, the present invention proposes a structure including a thin silicon substrate, and upper and lower insulating layers provided so as to sandwich the silicon substrate, wherein rigidity of the structure is substantially secured by the insulating layers. The present invention also contemplates provision of a packaged stacked semiconductor device which facilitates formation of through-electrodes; as well as a method for producing the semiconductor device.

Means for Solving the Problems

The present invention provides a packaged stacked semiconductor device which comprises bumps serving as external electrode terminals, the bumps being provided on a front surface and a back surface of the device, and which is stacked on another semiconductor device, substrate, or board having electrode terminals so that the bumps are directly and electrically connected to the electrode terminals. The packaged stacked semiconductor device is characterized by the following configuration. The device comprises a semiconductor substrate including through-electrodes which penetrate through the substrate. The semiconductor device has, on the front surface side of the semiconductor substrate, a plurality of circuit elements formed on the front surface of the substrate, which serves as an LSI formation surface, a multi-layer wiring section provided on the LSI formation surface and connected to the circuit elements, the through-electrodes being connected to a predetermined wiring layer of the multi-layer wiring section. The semiconductor device has a first insulating film provided on the top surface of the multi-layer wiring section, post electrodes which are connected to the wiring layer, a second insulating film formed so as to cover the front surface of the semiconductor substrate, exclusive of tip end surfaces of the post electrodes, external connection bumps connected to the tip end surfaces of the post electrodes. The semiconductor device has, on the front surface side of the semiconductor substrate, a third insulating film formed so that tip end surfaces of the through-electrodes are exposed, bump formation regions which are provided on the third insulating film and are connected to the tip end surfaces of the through-electrodes by means of wiring, a fourth insulating film formed so as to cover the bump formation regions, and external connection bumps connected to the bump formation regions through apertures provided in the fourth insulating film.

The present invention also provides a method for producing a plurality of packaged stacked semiconductor devices on a semiconductor substrate in the form of semiconductor wafer in a grid pattern formed by scribe lines, each of the devices comprising bumps serving as external electrode terminals, the bumps being provided on both a front surface and a back surface of the device, and the device being stacked on another semiconductor device, substrate, or board having electrode terminals so that the bumps are directly and electrically connected to the electrode terminals. In the production method, a plurality of semiconductor substrates, which are portions of a semiconductor wafer arranged in a grid pattern formed by scribe lines are provided, and a plurality of circuit elements are formed on the front surface of each semiconductor substrate, the front surface serving as an LSI formation surface. A multi-layer wiring section is formed on the LSI formation surface so that the section is connected to the circuit elements, and holes are provided in the semiconductor substrate. A first insulating film is formed so as to cover the side walls of the holes and the front surface of the semiconductor substrate. A metal material is charged into the holes to thereby form through-electrodes, and the through-electrodes are connected to a predetermined wiring layer in the multi-layer wiring section. Subsequently, post electrodes are formed so as to be connected to a predetermined wiring layer of the multi-layer wiring section. A second insulating film is formed on the front surface of the semiconductor substrate so that tip end portions of the post electrodes are exposed. The back surface of the semiconductor substrate is ground so that tip end portions of the through-electrodes are exposed, and a third insulating film is formed on the back surface of the semiconductor substrate so that tip end surfaces of the through-electrodes are exposed. Subsequently, bump formation regions are provided on the third insulating film formed on the back surface of the semiconductor substrate so that the bump formation regions are connected to the thus-exposed tip end surfaces of the through-electrodes by means of wiring. A fourth insulating film is formed on the wiring, and bumps are formed on the bump formation regions through apertures provided in the fourth insulating film. Bumps are formed on the tip end portions of the post electrodes on the front side of the semiconductor substrate.

EFFECTS OF THE INVENTION

According to the present invention, on the back side of the semiconductor device, the tip end surfaces of the through-electrodes can be made flush with the surface of the insulating film, or the tip end surfaces of the through-electrodes can be easily exposed, and subsequently, wiring can be formed through ink jetting by use of metal nanoparticles. Therefore, additional wiring can be formed on the back side at low cost.

According to the present invention, back wiring on the semiconductor device enables the device to be freely connected (stacked) on another component in three dimensions, and thus the device exhibits drastically increased degree of freedom in terms of combination. Similar to the case of PoP (package on package), which is a currently prevailing technique, the area occupied by the semiconductor device can be reduced by about ⅕ to about ⅒, and the height of the semiconductor device can be reduced by about ⅕.

According to the present invention, the semiconductor devices can be, in principle, infinitely connected in three dimensions, and the device is advantageous in that it can be effectively integrated into three-dimensional sections of small plane area (e.g., the device can be distributed to and integrated at different sections of a robot).

Although having a size comparable to that of a bare chip, the stacked semiconductor device of the present invention can be subjected to testing satisfactorily. In other words, the semiconductor device can be easily subjected to KGD (known good die) testing. Since the stacked semiconductor device of the present invention is in the form of single complete package, and includes bumps, etc., the device can be brought into reliable contact with a testing jig. That is, the semiconductor device, which has a size equal to that of a conventional bare chip, can be easily subjected to KGD testing for such a bare chip. Therefore, the semiconductor device does not require any additional process or jig, and thus does not cause an increase in cost.

In the present invention, a nitride film is employed as an insulating film, and the film is formed by use of decomposed species generated through catalytic decomposition of a raw material on a heated catalyst. Therefore, the temperature of an insulating film formation process can be lowered (to 200° C. or lower).

Thus, in a semiconductor wafer level implementation or semiconductor bare chip stacked structure, an insulating film provided around through-holes of a silicon substrate can be formed through deposition at low temperature. This facilitates formation of through-electrodes required for a considerable decrease in package size.

BRIEF DESCRIPTION OF THE DRAWINGS

FIG. 5 illustrates formation of Cu post electrodes which are connected to predetermined positions of the front surface of the semiconductor substrate.

FIG. 6 illustrates removal of a surface portion of a second insulating film.

FIG. 20 shows in detail a process for forming through-electrodes after completion of wafer processing, the process differing from that shown in FIG. 4.

BEST MODES FOR CARRYING OUT THE INVENTION

Figure 29:
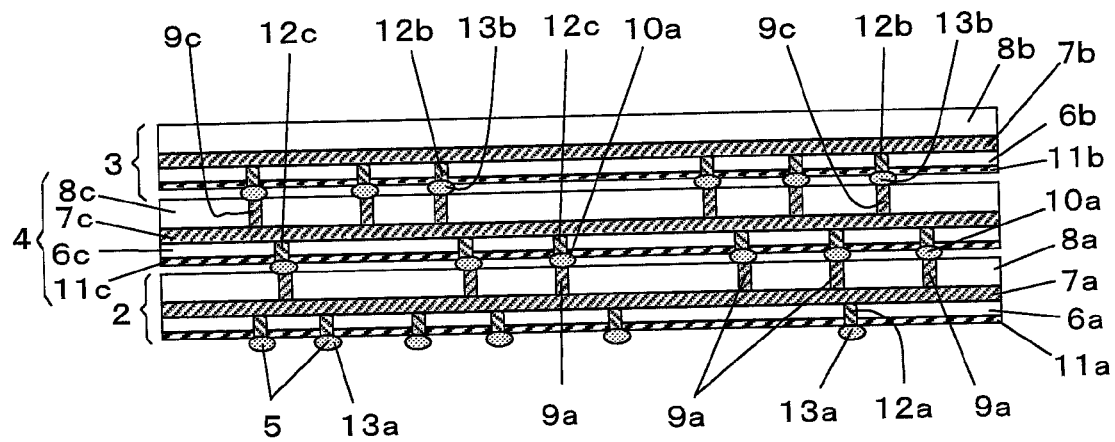
FIG. 29 is a cross-sectional view showing the three-dimensional stacked semiconductor device which has been previously applied by the present inventors.
Figure 30:
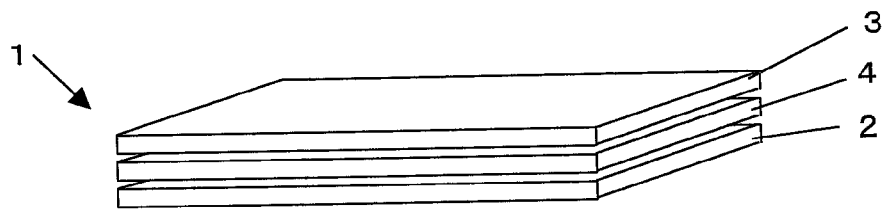
FIG. 30 is a schematic perspective view showing the entirety of the three-dimensional stacked semiconductor device of FIG. 29.
Figure 31:
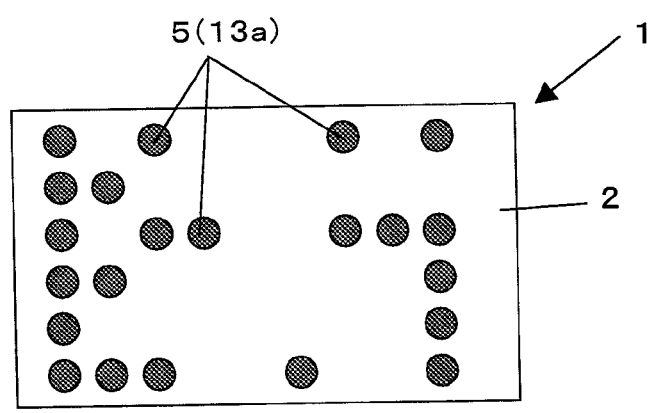
FIG. 31 shows the bottom surface of the device of FIG. 29.

Before description of the present invention, a three-dimensional stacked semiconductor device which has been previously applied by the present inventors (Japanese Patent Application No. 2003-370651) will be described with reference to FIGS. 29 to 31. FIG. 29 is a cross-sectional view showing the three-dimensional stacked semiconductor device; FIG. 30 is a schematic perspective view showing the entirety of the device; and FIG. 31 shows the bottom surface of the device. As shown in FIG. 29, the three-dimensional stacked semiconductor device includes a first semiconductor device 2 which serves as a bottom unit; a third semiconductor device 4 which serves as a middle unit and is provided and fixated onto the top surface of the first semiconductor device 2; and a second semiconductor device 3 which serves as a top unit and is provided and fixated onto the top surface of the third semiconductor device 4.

In description of the first, second, and third semiconductor devices 2, 3, and 4, common components among these devices are denoted by the same reference numerals, which are marked with a (for the first semiconductor device 2), b (for the second semiconductor device 3), or c (for the third semiconductor device 4). The first semiconductor device 2 includes a semiconductor substrate 6a formed of silicon (Si). A multi-layer wiring section 7a is formed on a first main surface (top surface as viewed in FIG. 29, on which a circuit (e.g., IC) is formed) of the semiconductor substrate 6a. A first insulating layer 8a formed of insulating resin is provided on the multi-layer wiring section 7a.

Post electrodes 9a are provided so as to penetrate through the first insulating layer 8a, and to be electrically connected to a predetermined wiring layer in the multi-layer wiring section 7a. Projection electrodes (bumps) 10a are provided on exposed portions of the post electrodes 9a. If necessary, various elements, such as an active element (e.g., a transistor or a diode) and a passive element (e.g., a resistor, a capacitor, or an inductor), are formed on the first main surface of the semiconductor substrate 6a. A second insulating layer 11a formed of insulating resin is provided on a second main surface (bottom surface as viewed in FIG. 29) of the semiconductor substrate 6a, the second main surface being opposite the first main surface. Through-electrodes 12a are provided so as to extend from predetermined positions (at a predetermined depth) of the multi-layer wiring section 7a, and to penetrate through the semiconductor substrate 6a and the second insulating layer 11a. The through-electrodes 12a are electrically connected to a predetermined wiring layer in the multi-layer wiring section 7a. Projection electrodes 13a are provided on exposed portions of the through-electrodes 12a.

The third semiconductor device 4 (middle unit) has almost the same configuration as the first semiconductor device 2, except that the arrangement patterns of post electrodes 9c and through-electrodes 12c differ from those of the post electrodes 9a and through-electrodes 12a of the first semiconductor device 2. The through-electrodes 12c, which are provided on the lower side of the third semiconductor device 4 (middle unit), respectively face the post electrodes 9a, which are provided on the upper side of the first semiconductor device 2 (bottom unit). The through-electrodes 12c are electrically connected to the post electrodes 9a via the projection electrodes 10a. Through temporary heating, the projection electrodes 10a become connection members for connecting the electrodes 12c and the electrodes 9a. Through this connection, the third semiconductor device 4 is fixated onto the first semiconductor device 2.

The second semiconductor device 3 (top unit) has almost the same configuration as the first semiconductor device 2, except that post electrodes are not provided on the upper side thereof. Through-electrodes 12b provided on the lower side of the second semiconductor device 3 (top unit) respectively face the post electrodes 9c, which are provided on the upper side of the third semiconductor device 4 (middle unit). The through-electrodes 12b are electrically connected to the post electrodes 9c via projection electrodes 13b. Through this connection, the second semiconductor device 3 is fixated onto the third semiconductor device 4.

When the semiconductor devices are stacked and fixated to one another by means of such connection members, connection paths between the semiconductor devices can be shortened, and the overall thickness of the resultant stacked semiconductor device can be considerably reduced.

The present invention is directed to further improvements in back surface additional wiring on such a three-dimensional stacked semiconductor device, as well as a method for forming through-holes in a semiconductor substrate and insulating the through-holes, the method being carried out at high temperature and thus applicable to a semiconductor device mounting process.

Figure 1:
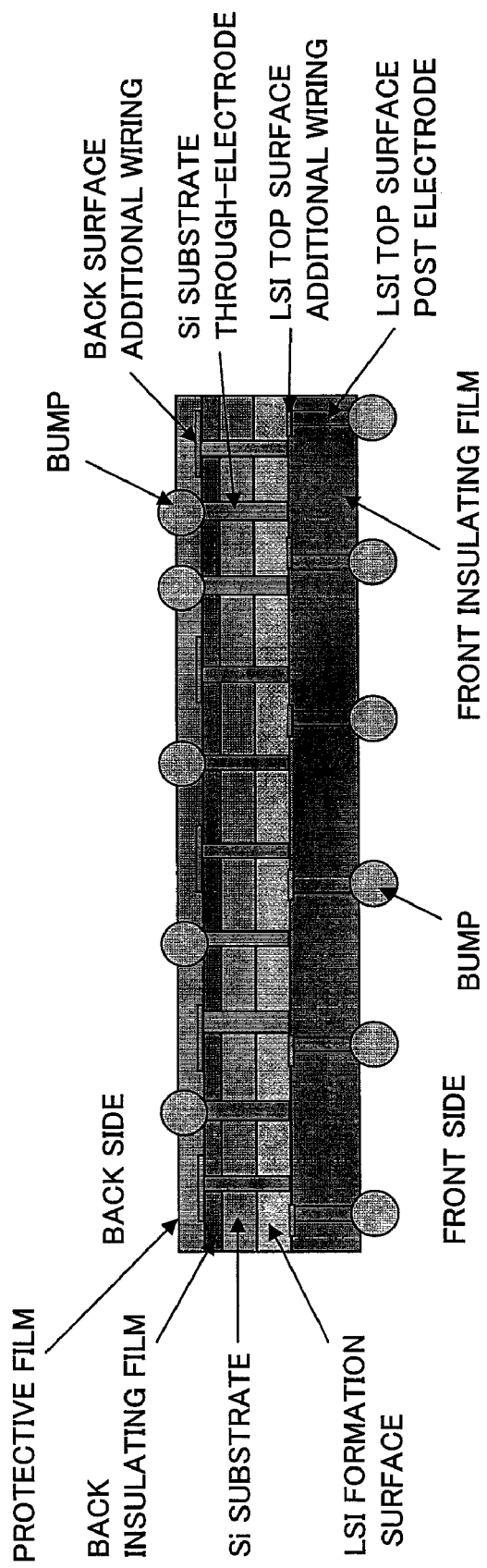
FIG. 1 is a cross-sectional view showing a stacked semiconductor device to which the present invention can be applied.

The present invention will next be described with reference to embodiments. FIG. 1 is a cross-sectional view showing a packaged stacked semiconductor device to which the present invention can be applied. The top surface of an Si substrate serves as an LSI formation surface. As used herein, the side on which the LSI formation surface is located is called "front side," and the opposite side is called "back side." The bottom side as viewed in FIG. 1 corresponds to the front side. A circuit (circuit element) is formed on the LSI formation surface.

The semiconductor substrate (Si substrate), which has the LSI formation surface, is provided with through-electrodes which penetrate through the Si substrate so as to establish connections between the front side and the back side of the substrate. On the front side, a multi-layer wiring section is formed on the LSI formation surface (hereinafter the wiring section may be referred to as an "LSI top surface additional wiring section"). A plurality of columnar Cu post electrodes are formed so as to be connected to predetermined positions of the LSI top surface wiring section (hereinafter the post electrodes may be referred to as "LSI top surface post electrodes"). The post electrodes are covered with a front insulating film (i.e., second insulating film described below) through, for example, plastic molding, and the tip end portions of the post electrodes are provided with external connection bumps.

The back surface of the Si substrate; i.e., the surface on the back side (top side as viewed in FIG. 1), is ground so that tip end portions of the through-electrodes are exposed. Subsequently, merely the Si substrate is subjected to selective etching so that tip end portions of the through-electrodes project from the back surface of the semiconductor substrate. Alternatively, a back insulating film (i.e., third insulating film described below) is formed on the Si substrate through selective application so that tip end surfaces of the through-electrodes are exposed. Additional wiring which extends between the tip end surfaces of the through-electrodes and bump regions disposed at predetermined positions is formed through ink jetting or screen printing. The additional wiring is connected to external connection bumps through apertures formed in a protective film (i.e., fourth insulating film described below) which is provided so as to cover the additional wiring.

In this manner, there is constructed a packaged stacked semiconductor device which includes external connection bump electrodes on both the front and back sides, and which is stacked with another semiconductor device, etc.

Figure 2:
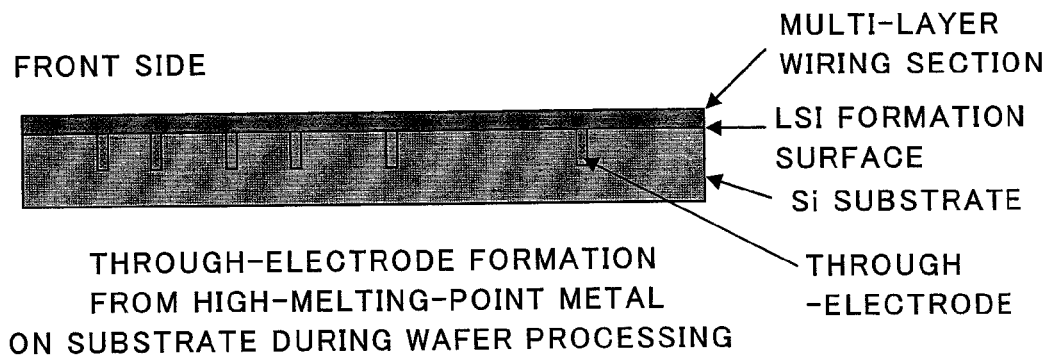
FIG. 2 is a cross-sectional view showing a processed wafer including through-electrodes formed, during wafer processing, on a semiconductor substrate (Si substrate) having IC, etc. thereon (i.e., processed wafer cross-sectional view I).

Production of such a packaged stacked semiconductor device will next be described in more detail. FIG. 2 is a cross-sectional view showing a processed wafer including through-electrodes formed, during wafer processing, in a semiconductor substrate (Si substrate) having IC, etc. thereon (processed wafer cross-sectional view I). As shown in FIG. 2, a semiconductor substrate (thickness: several hundreds of μm) is provided, and then a circuit (circuit element) is formed on the front surface (first main surface) of the semiconductor substrate, the surface serving as an LSI formation surface. A multi-layer wiring section is formed on the front surface of the semiconductor substrate. FIG. 2 shows the case where through-electrodes are formed in the semiconductor substrate from a high-melting-point metal during wafer processing. Subsequently, although not illustrated, a first insulating film is formed on the multi-layer wiring section, and an additional wiring layer is formed on the first insulating film for connecting a final wiring layer of the multi-layer wiring section to post electrodes.

Figure 3:
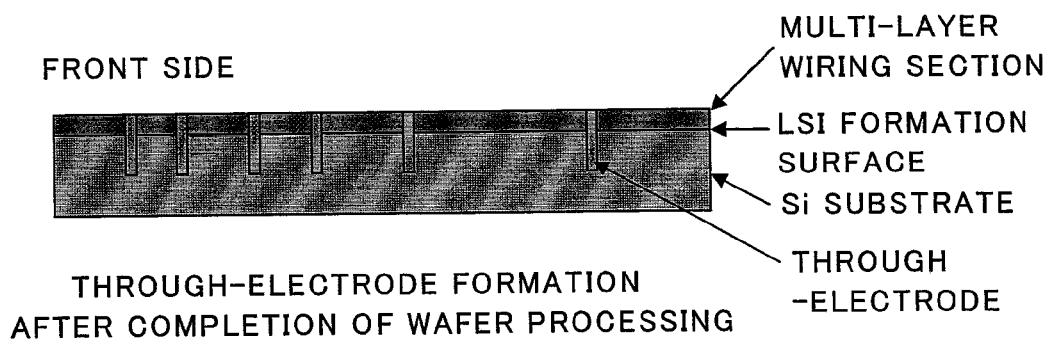
FIG. 3 is a cross-sectional view showing a processed wafer including through-electrodes formed after completion of wafer processing (i.e., processed wafer cross-sectional view II).
Figure 4:
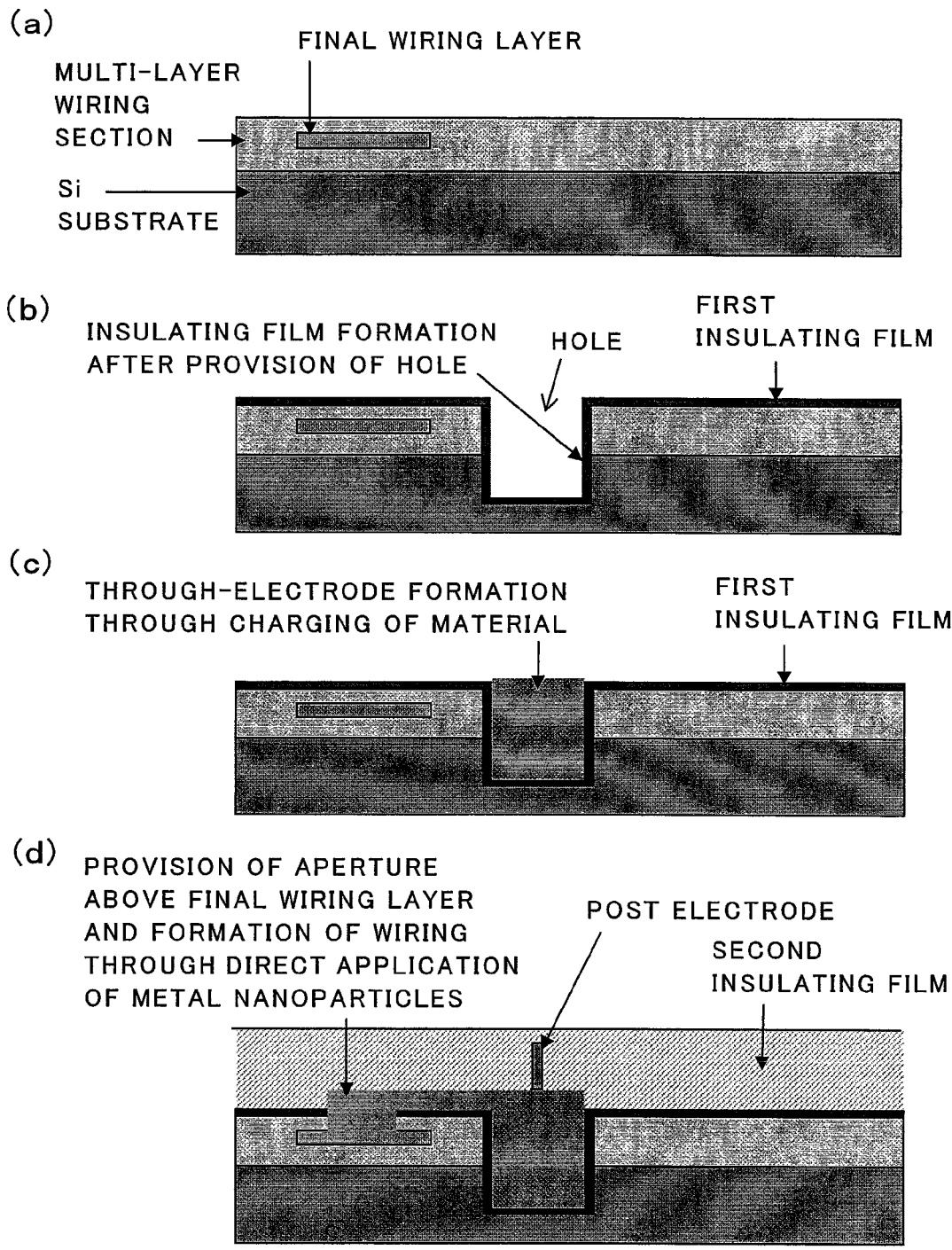
FIG. 4 shows in detail a process for forming through-electrodes after completion of wafer processing for the production of the wafer shown in FIG. 2.

In contrast, FIG. 3 is a cross-sectional view showing a processed wafer including through-electrodes formed after completion of wafer processing (processed wafer cross-sectional view II). FIG. 4 shows in detail a process for forming through-electrodes after completion of wafer processing shown in FIG. 3. As shown in FIG. 4(a), a multi-layer wiring section is formed on the front surface of the semiconductor substrate, and a final wiring layer to be connected to a through-electrode is present in the multi-layer wiring section. Subsequently, as shown in FIG. 4(b), a hole corresponding to a through-electrode is provided so as to penetrate through the multi-layer wiring section and to reach a predetermined depth of the semiconductor substrate, and a first insulating film is formed so as to cover the side wall of the hole and the top surface of the multi-layer wiring section at such a low temperature that does not adversely affect the multi-layer wiring section.

Subsequently, as shown in FIG. 4(c), metal nanoparticles are charged into the hole through ink jetting, or through two-time squeegeeing for formation of a through-electrode. The hole provided has, for example, a diameter of several μm to about 30 μm and a depth of about 5 to about 50 μm. Subsequently, as shown in FIG. 4(d), an aperture is provided above the final wiring layer, and, through this aperture, the final wiring layer and the through-electrode are directly connected by wiring formed of metal nanoparticles. A post electrode is formed so as to be connected to a predetermined position of this wiring or a position of the through-electrode, and then a second insulating film is formed on the front surface of the first insulating film. In the subsequent step, a surface portion of the second insulating film is removed so that the film has a predetermined thickness and the tip end portion of the post electrode is exposed.

FIG. 5 shows the state where a plurality of columnar Cu post electrodes are formed so as to be connected to predetermined positions of the front surface of the semiconductor substrate. A second insulating film is formed on the front surface of the semiconductor substrate so that the post electrodes are covered with the second insulating film. The second insulating film is formed from an insulating organic resin such as epoxy resin or polyimide resin. The second insulating film is formed through, for example, plastic molding.

Subsequently, as shown in FIG. 6, a surface portion of the second insulating film is removed so that the film has a predetermined thickness. Upper and lower views of FIG. 6 correspond to cross-sectional views of the wafer shown in FIG. 8, as taken along lines A-A' and a-a', respectively. The surface of the second insulating film is ground so that tip end portions of the post electrodes are exposed. The greater the amount of grinding, not only the smaller the thickness of the post electrodes, but also the smaller the thickness of the second insulating film. The second insulating film is ground so as to have a thickness of about 40 to about 200 μm.

Figure 7:
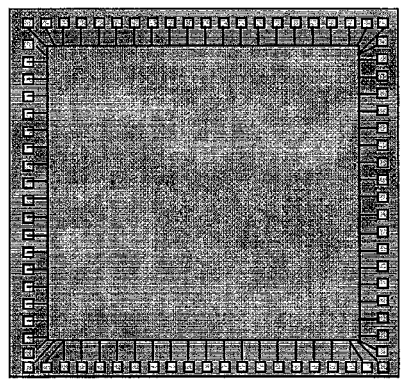
FIG. 7 is a plan view showing the state where bonding pads are provided on the periphery of a chip after completion of wafer processing.
Figure 8:
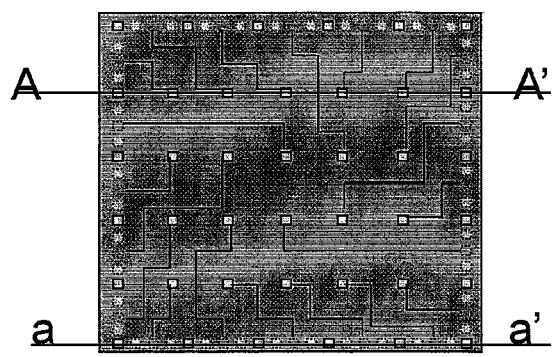
FIG. 8 is a plan view showing the state where bonding pads are provided in the internal area after additional wiring on the wafer.

FIG. 7 is a plan view showing the state where bonding pads are provided on the periphery of the resultant chip after completion of wafer processing. FIG. 8 is a plan view showing the state where bonding pads are provided in the internal area after formation of additional wiring on the wafer.

Figure 9:
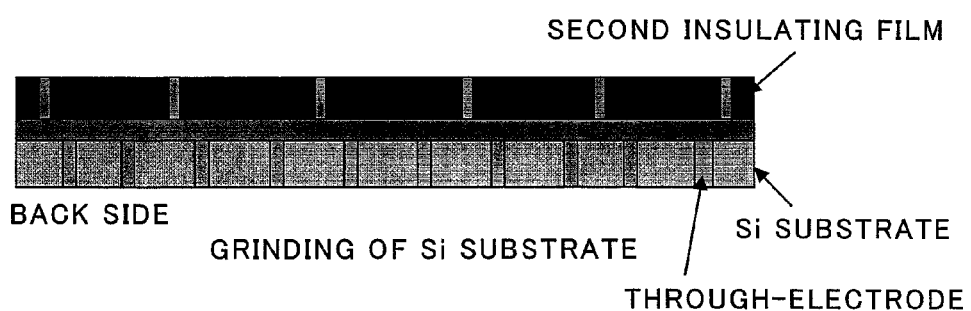
FIG. 9 illustrates grinding of the second main surface (back surface) of the semiconductor substrate.

Subsequently, as shown in FIG. 9, the back surface (second main surface) of the semiconductor substrate is ground so that tip end portions of the through-electrodes are exposed. Through this grinding, the thickness of the semiconductor substrate is reduced to about 10 to about 50 µm, which is smaller than that of the second insulating film. Even when the thickness of the semiconductor substrate is reduced to such a low level, the strength of the entirety of the wafer can be maintained, due to rigidity of the second insulating film of large thickness. Thus, while the second insulating film is held, the semiconductor substrate is ground until the thickness thereof becomes smaller than that of the second insulating film. Therefore, the semiconductor substrate can be prevented from being cracked or broken during handling thereof.

Figure 10:
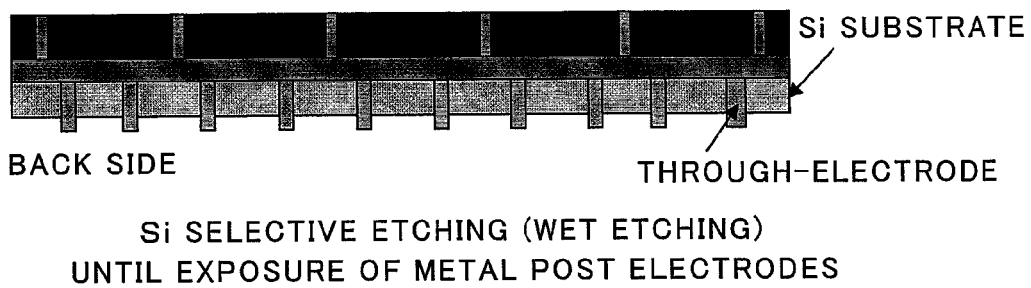
FIG. 10 illustrates etching of the back surface of the semiconductor substrate.

Subsequently, as shown in FIG. 10, the back surface of the semiconductor substrate is subjected to etching so that the substrate has a predetermined thickness. The semiconductor substrate is subjected to wet etching by use of a hydrofluoric acid etchant so that merely Si is selectively etched, but the through-electrodes are not etched. Through this etching, tip end portions of the through-electrodes project about 5 µm from the surface of the semiconductor substrate having a thickness of about 20 µm.

Figure 11:
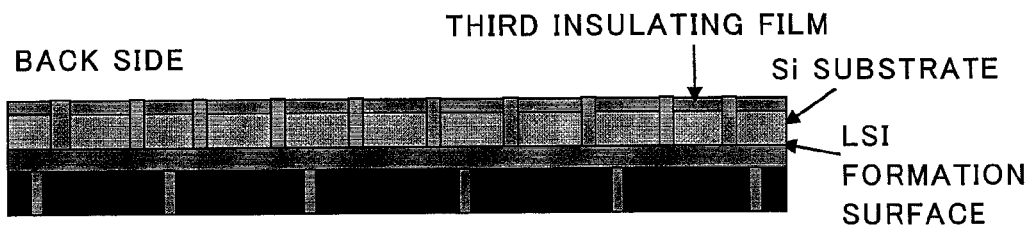
FIG. 11 illustrates formation of an insulating film on the back surface of the semiconductor substrate.

Subsequently, as shown in FIG. 11, the wafer is inverted, and a third insulating film is formed on the back surface of the silicon semiconductor substrate. In this case, the insulating film is formed so that the through-electrodes are hidden. Thereafter, the third insulating film and the through-electrodes (metal post electrodes) are subjected to simultaneous cutting so that the post electrodes are exposed, and tip end surfaces of the electrodes are made flush with the surface of the insulating film. The thickness of the third insulating film is regulated to such a level that at least electrical insulation can be attained.

Alternatively, the third insulating film may be formed through an ink jetting technique. Through use of ink jetting, an insulating film can be formed on the back surface of the silicon semiconductor substrate, while tip end surfaces of the through-electrodes are exposed.

Figure 12:
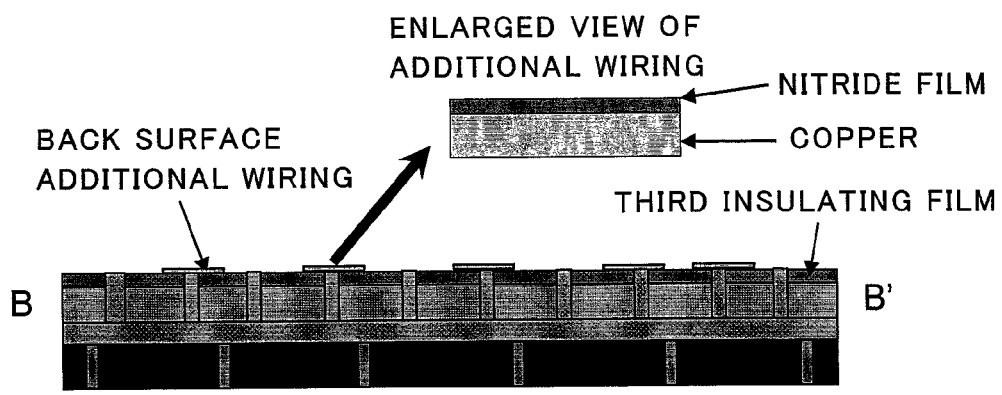
FIG. 12 is a cross-sectional view of the wafer shown in FIG. 13, as taken along line B-B'.
Figure 13:
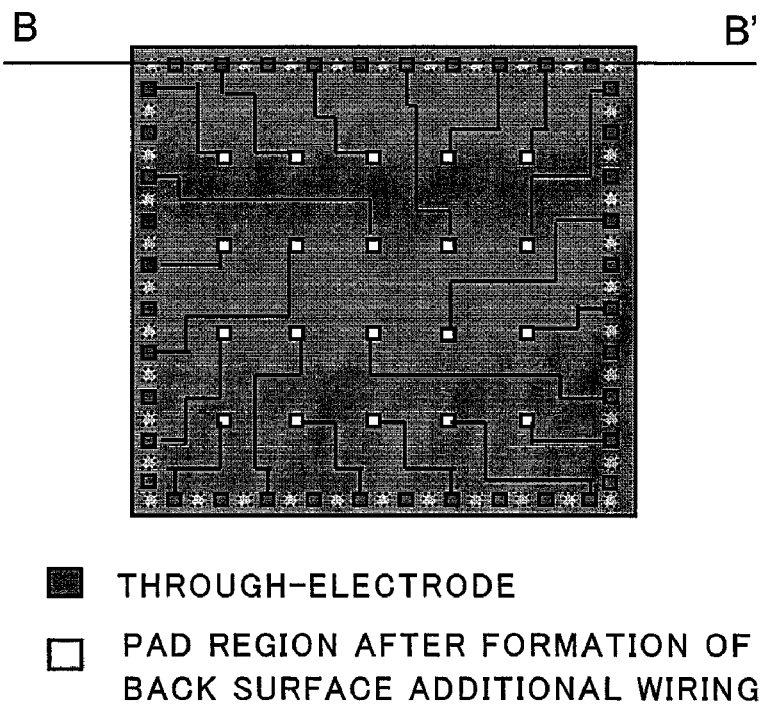
FIG. 13 shows the arrangement after formation of additional wiring on the back surface.
Figure 14:
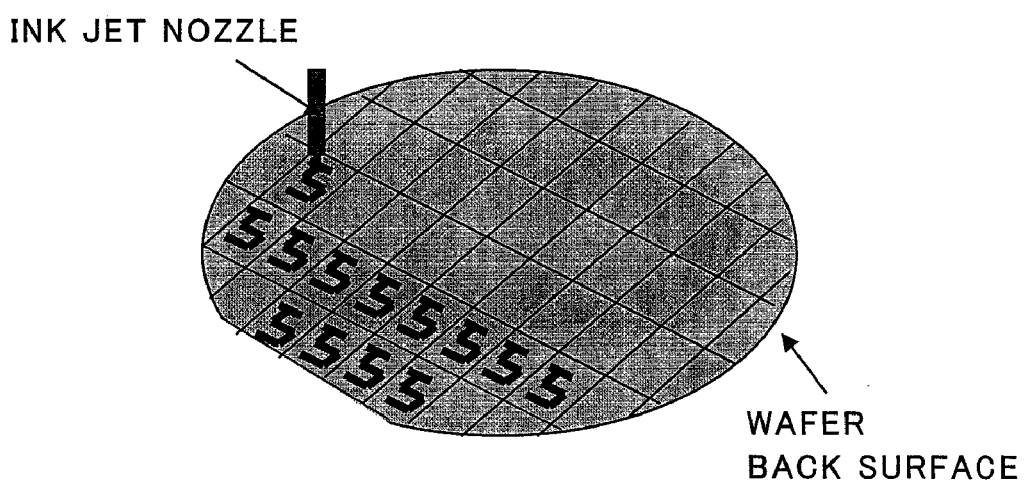
FIG. 14 shows the case where additional wiring is formed on the back surface through ink jetting by use of metal nanoparticles.
Figure 15:
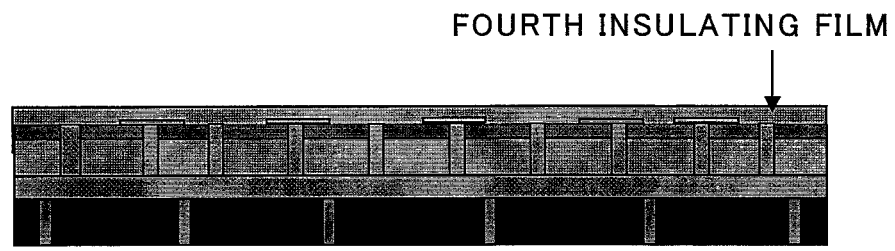
FIG. 15 illustrates an insulating film formed on the addition wiring.

Subsequently, as shown in FIG. 12, additional wiring is formed on the third insulating film provided on the back surface of the semiconductor substrate. FIG. 12 is a cross-sectional view of the wafer shown in FIG. 13, as taken along line B-B'. On this additional wiring, as shown by an enlarged view in FIG. 12, for example, a copper wire is coated with a nitride film. FIG. 13 shows arrangement of electrodes after formation of the additional wiring on the back surface. As shown in FIG. 13, the through-electrodes are connected to pad regions (bump formation regions) by means of wiring. FIG. 14 shows the case where additional wiring is formed on the back surface through ink jetting by use of metal nanoparticles (e.g., copper nanoparticles). Alternatively, this additional wiring may be formed through screen printing by use of metal nanoparticles. In general, for the production of a semiconductor device, a semiconductor wafer of large area is provided, and numerous semiconductor elements of the same type which have been simultaneously formed through various processes are finally arranged in a grid pattern formed by scribe lines. The resultant semiconductor wafer is cut along vertical and horizontal scribe lines, and then separated into numerous semiconductor devices (semiconductor chips). FIG. 14 shows the case where additional wiring is formed on the back surface of the semiconductor wafer. Subsequently, as shown in FIG. 15, a fourth insulating film is formed on the thus-formed additional wiring. The fourth insulating film may be formed from a solder resist. The fourth insulating film is formed so as to have a thickness of 30 µm or less, which is smaller than that of the silicon substrate. Therefore, the thickness of the aforementioned second insulating film is greater than that of the silicon substrate or the fourth insulating film.

Figure 16:
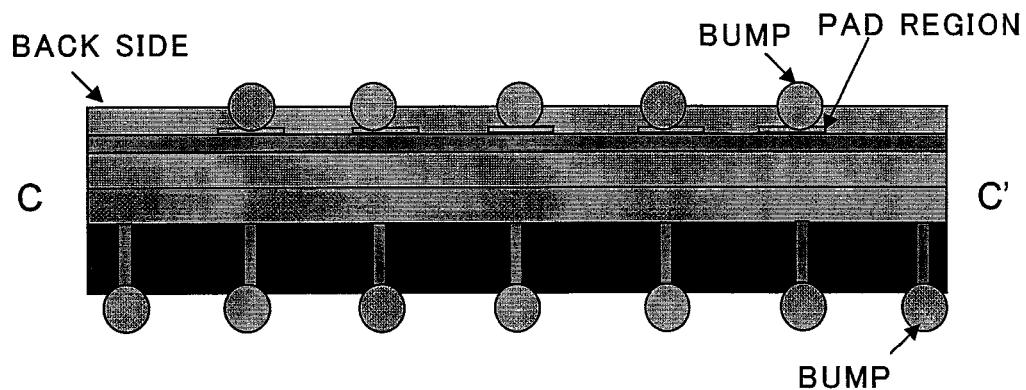
FIG. 16 is a cross-sectional view of the wafer shown in FIG. 17, as taken along line C-C'.
Figure 17:
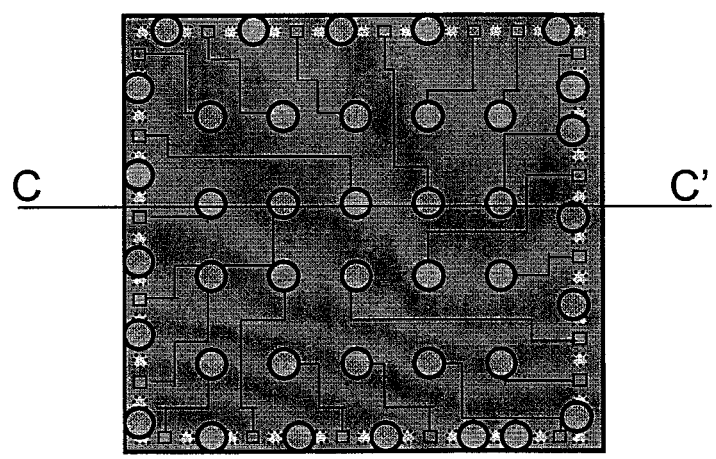
FIG. 17 is a plan view showing the back surface of the wafer after formation of bumps.
Figure 18:
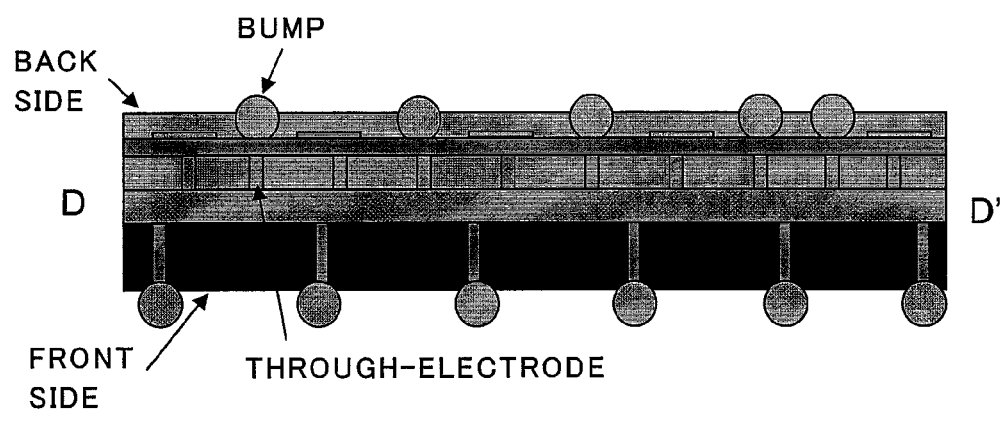
FIG. 18 is a cross-sectional view of the wafer shown in FIG. 19, as taken along line D-D'.
Figure 19:
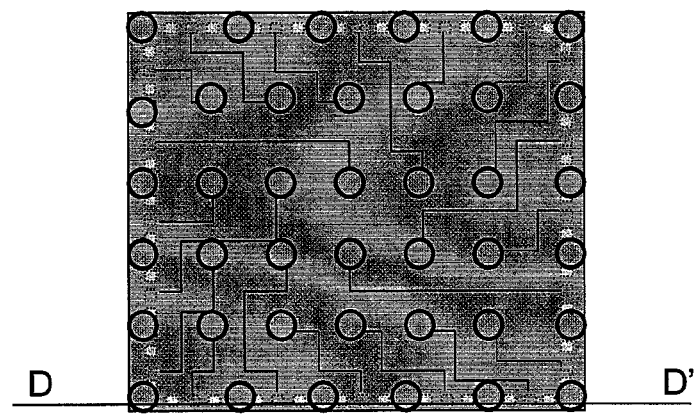
FIG. 19 is a plan view showing the front surface of the wafer after formation of bumps.

Subsequently, as shown in FIGS. 16 and 18, bumps are formed on both the front and back surfaces of the wafer. On the back side, apertures are provided at regions of the fourth insulating film corresponding to bump formation regions on the additional wiring, and bumps are formed in the apertures. FIG. 16 is a cross-sectional view of the wafer shown in FIG. 17, as taken along line C-C'. On the back side, as shown in FIG. 16, bumps are connected to the pad regions. FIG. 17 is a plan view showing the back surface of the wafer after formation of bumps. FIG. 18 is a cross-sectional view of the wafer shown in FIG. 19, as taken along line D-D'. As shown in this cross-sectional view, on the back side, bumps are connected to the through-electrodes. FIG. 19 is a plan view showing the front surface of the wafer after formation of bumps. On the front side, bumps are connected to tip end surfaces of the post electrodes shown in FIG. 6. Bumps formed on both the front and back surfaces of the wafer are, for example, bump electrodes formed of solder balls, gold balls, gold-plate copper balls, or similar balls; projection electrodes formed through screen printing and heating; or convex electrodes formed through ink jetting.

FIG. 20 shows in detail a process for forming through-electrodes after completion of wafer processing, the process differing from that shown in FIG. 4. As shown in FIG. 20(A), a multi-layer wiring section is formed on the front surface of a semiconductor substrate, and a final wiring layer to be connected to a through-electrode is present in the multi-layer wiring section. Subsequently, as shown in FIG. 20(B), a hole corresponding to a through-electrode is provided in the multi-layer wiring section and the semiconductor substrate, and a first insulating film is formed through oxidation of the wall of the hole and the top surface of the multi-layer wiring section. Subsequently, as shown in FIG. 20(C), an aperture is formed in the multi-layer wiring section through direct laser irradiation, to thereby provide a portion for connecting the final wiring layer to a through-electrode. Subsequently, as shown in FIG. 20(D), through squeegeeing of metal nanoparticles, a through-electrode is formed while the aperture of the multi-layer wiring section is filled with the metal nanoparticles.

Figure 21:
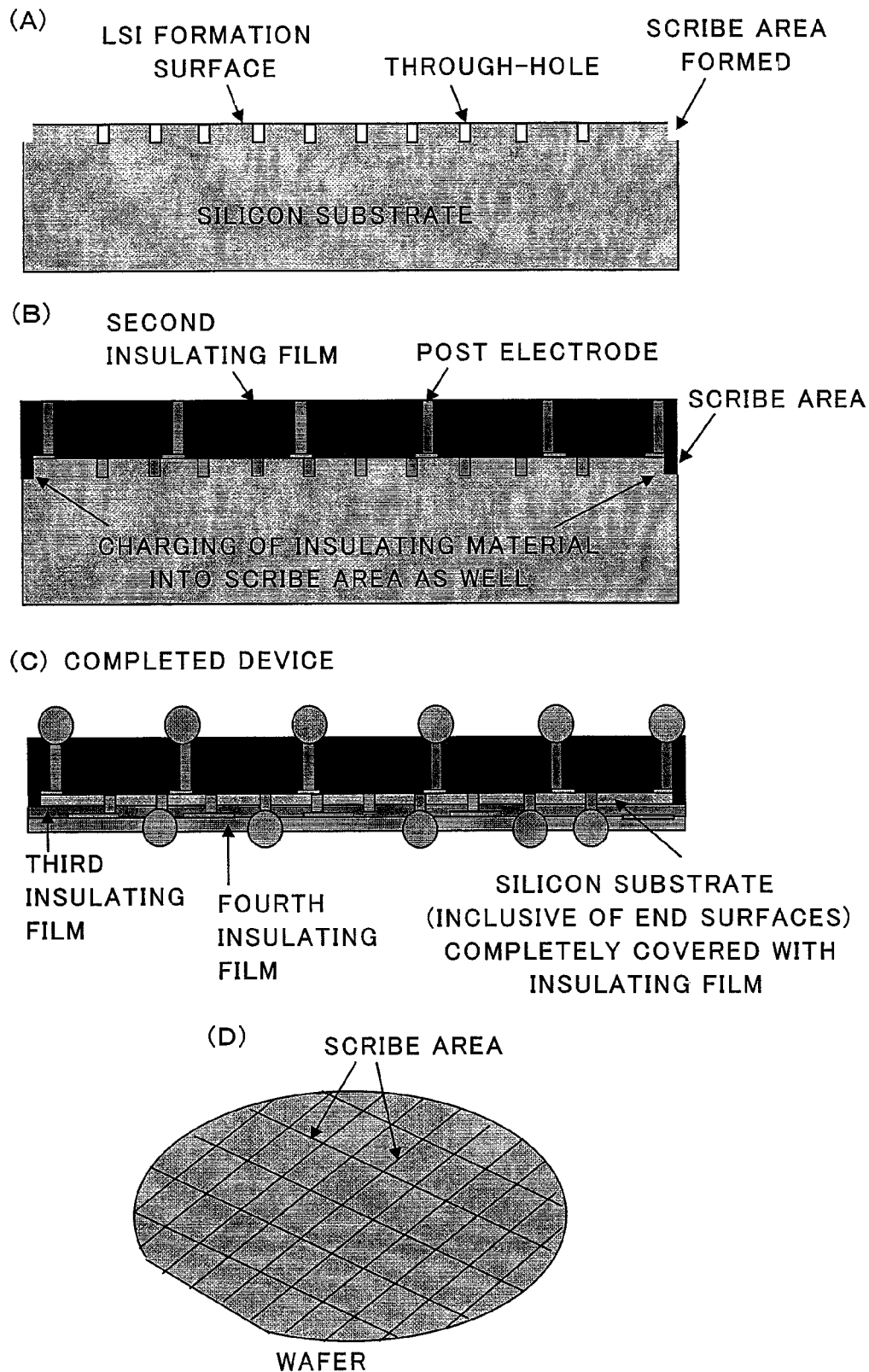
FIG. 21 illustrates a packaged stacked semiconductor device having a configuration different from that described above, as well as a method for producing the device.

FIG. 21 illustrates a packaged stacked semiconductor device having a configuration different from that described above, as well as a method for producing the device. FIG. 21(A) illustrates scribe areas which are formed in parallel with formation of through-holes. The silicon substrate shown in FIG. 21(A) is similar to that described above with reference to FIGS. 3 and 2, in that the front surface (first main surface) of the semiconductor substrate (thickness: several hundreds of µm) serves as an LSI formation surface, and a multi-layer wiring section (not illustrated) is formed on the front surface. However, in the substrate shown in FIG. 21, scribe areas having a predetermined width (see FIG. 21(D)) are formed in parallel with formation of through-holes. As described above, a semiconductor wafer of large area is provided, and the semiconductor wafer is subjected to various processes. Finally, the resultant wafer is cut in vertical and horizontal directions, and then separated into numerous semiconductor devices. In this case, the vertical/horizontal cutting is performed along the aforementioned scribe areas.

Subsequently, as described above with reference to FIGS. 5 and 6, post electrodes are formed, and a second insulating film is formed so as to cover the post electrodes. In this case, as shown in FIG. 21(B), an insulating material constituting the second insulating film (e.g., an insulating organic resin such as epoxy resin or polyimide resin) is also charged into the scribe areas.

In a large number of semiconductor devices produced as a result of cutting the thus-processed semiconductor wafer in vertical and horizontal directions, the periphery of the silicon substrate (including the front surface and end surfaces) is completely covered with the insulating film. FIG. 21(C) shows the thus-completed stacked semiconductor device.

Figure 22:
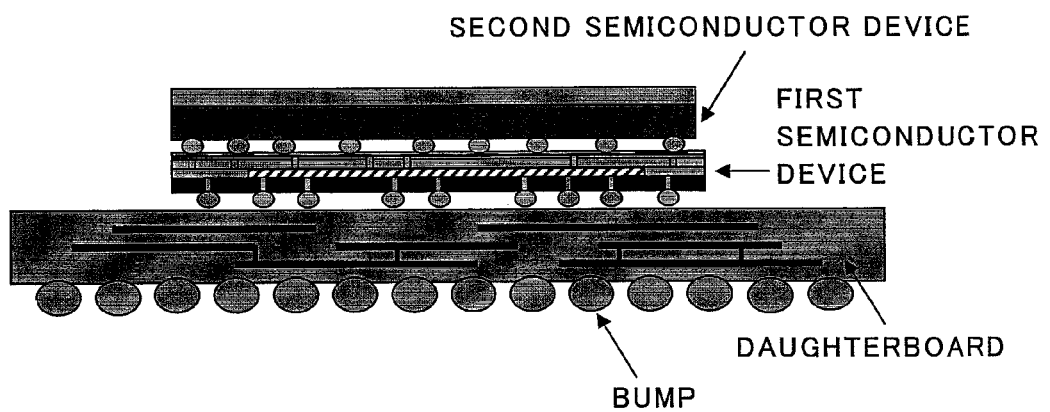
FIG. 22 is a schematic cross-sectional view showing the state where stacked semiconductor devices are mounted.

FIG. 22 is a schematic cross-sectional view showing the state where packaged stacked semiconductor devices are mounted. A first or second semiconductor device shown in FIG. 22 can be configured as described above. As shown in FIG. 22, no bump electrodes are formed on the top surface of the second semiconductor device. As shown in FIG. 22, when an upper semiconductor device has a size equal to or smaller than that of a lower semiconductor device, these semiconductor devices are aligned with each other so that connection regions of the devices are overlapped with one another, and projection electrodes corresponding to the connection regions are temporarily heated and melted by passing the devices through a furnace, to thereby bond the devices together. This bonding can produce a stacked semiconductor device.

The thus-produced stacked semiconductor device is mounted on the top surface of a daughterboard formed of a multi-layer wiring board. The daughterboard has a plurality of bump electrodes on its bottom surface, and non-illustrated lands provided on its top surface. The arrangement pattern of external electrode terminals of the stacked semiconductor device corresponds to that of the aforementioned lands. Therefore, the stacked semiconductor device can be mounted on the daughterboard through reflow of the external electrode terminals.

Figure 23:
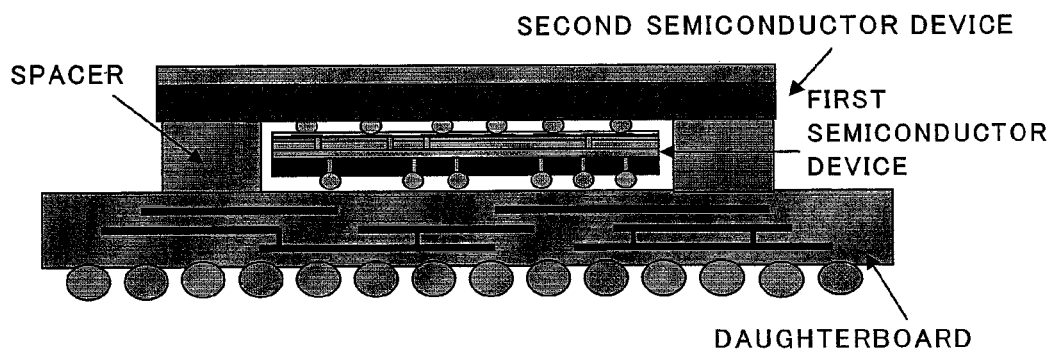
FIG. 23 is a cross-sectional view showing the case where a second semiconductor device is stacked on a first semiconductor device whose area is smaller than that of the second semiconductor device.
Figure 24:
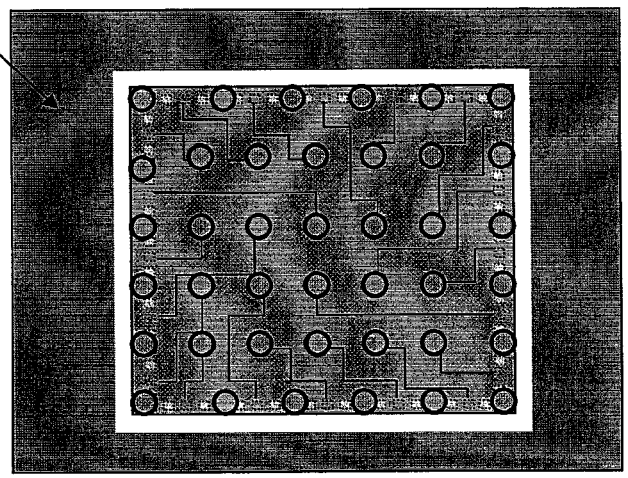
FIG. 24 is a plan view of FIG. 23.

FIG. 23 (cross-sectional view) and FIG. 24 (plan view) show the case where a second semiconductor device is provided on a first semiconductor device whose area is smaller than that of the second semiconductor device. This stacked configuration can be achieved by supporting a peripheral portion of the second semiconductor device (i.e., upper semiconductor device) by the daughterboard via a spacer such that the first semiconductor device is located in a space defined by the spacer.

Figure 25:
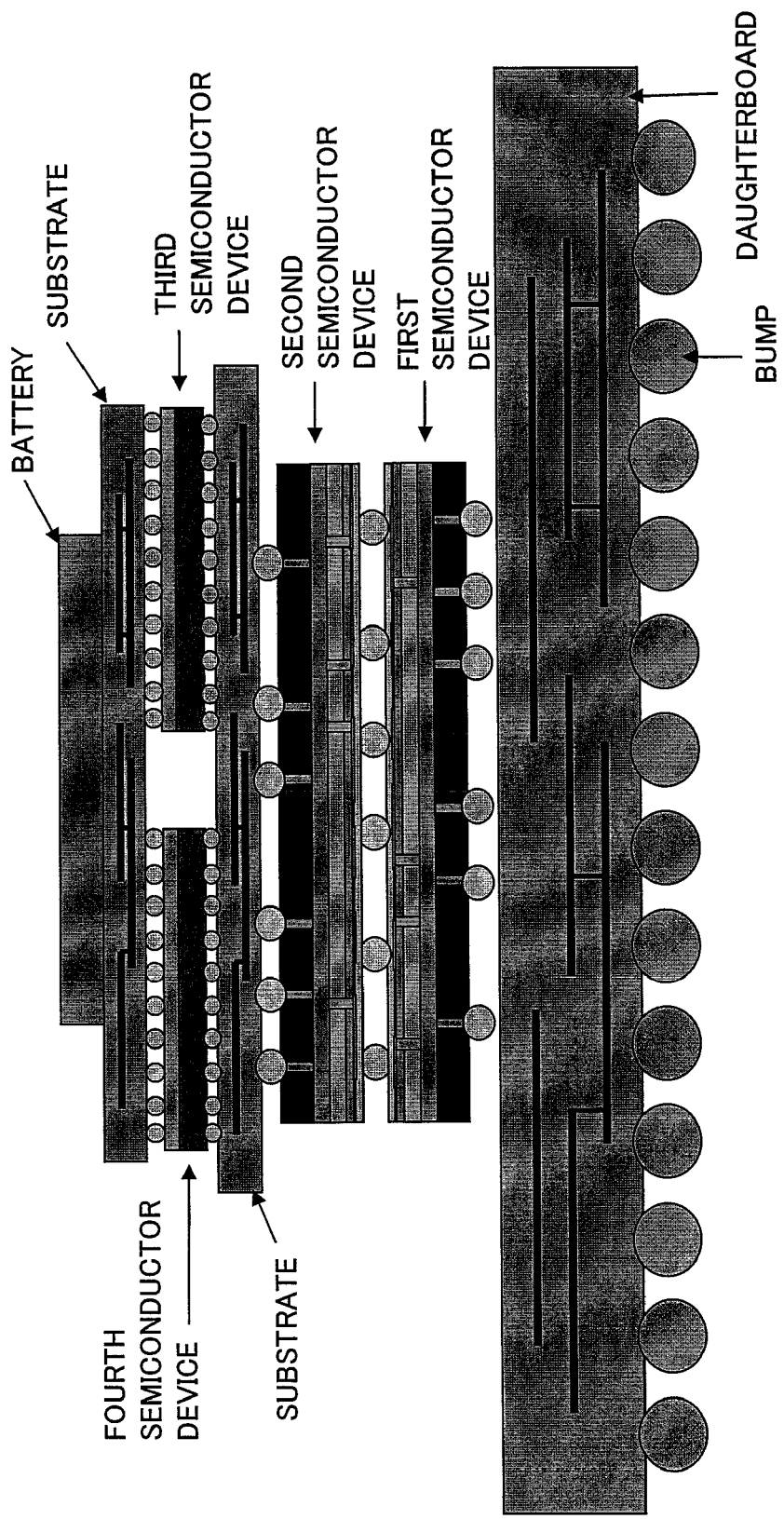
FIG. 25 is a schematic cross-sectional view showing the state where stacked semiconductor devices are mounted.

FIG. 25 is a schematic cross-sectional view showing the state where more stacked semiconductor devices are mounted. FIG. 25 shows four semiconductor devices (i.e., first to fourth semiconductor devices), each of which can be configured as described above. The semiconductor devices and substrates are aligned with one another so that connection regions of the devices and substrates are overlapped with one another, and projection electrodes corresponding to the connection regions are temporarily heated and melted by passing the devices and substrates through a furnace, to thereby bond the devices and substrate together. This stacking and bonding can produce a stacked semiconductor device.

The thus-produced stacked semiconductor device is mounted on the top surface of a daughterboard formed of a multi-layer wiring board. A battery can be mounted on the uppermost portion of the semiconductor device. Thus, when a substrate or a heat radiation plate is inserted between such semiconductor devices, in principle, the devices can be infinitely connected in three dimensions.

Next will be described in detail removal of a solvent and treatment for reducing resistance, which are carried out after additional wiring through ink jetting mentioned above with reference to FIG. 14. Copper oxide or contaminated organic solvent resulting from additional wiring through ink jetting is removed by use of atomic hydrogen, or species generated through decomposition of ammonia (hereinafter may be referred to as "ammonia-decomposed species") in a copper wire cleaning apparatus.

In a known wiring process, an intended wiring pattern is drawn through ink jetting (i.e., a technique practically used in printers) of an organic solvent containing nanoparticles of a metal (e.g., copper, silver, or gold). Copper is readily oxidized, as compared with a noble metal such as silver or gold, which is less likely to be oxidized. Therefore, after drawing of a copper wiring pattern, there are required thermal treatment for evaporating an organic solvent and binding copper particles together, as well as treatment for reducing resistance.

Figure 26:
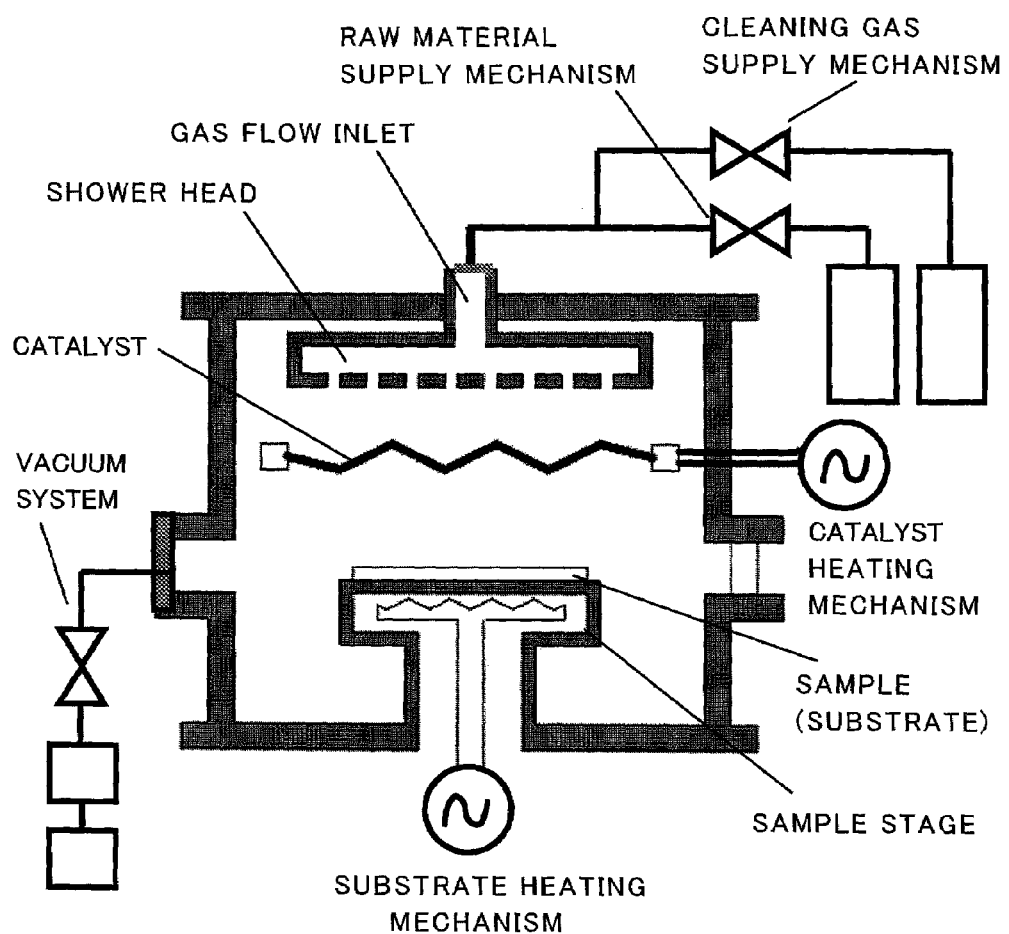
FIG. 26 is a schematic cross-sectional view showing a treatment apparatus.

FIG. 26 is a schematic cross-sectional view showing a treatment apparatus serving as a copper wire cleaning apparatus. Hydrogen or a hydrogen-containing compound (e.g., ammonia or hydrazine), serving as a raw material of atomic hydrogen or ammonia-decomposed species, is fed into a reaction chamber through a gas flow inlet provided on the top surface of the chamber by means of a cleaning gas supply mechanism.

A substrate heating mechanism (e.g., a heater) is provided outside and directly below the reaction chamber, and a sample (substrate) is placed on a sample stage provided inside the reaction chamber and directly above the heating mechanism. The sample is placed on the stage so that a surface on which metal particles are deposited faces upward. A catalyst formed of, for example, tungsten wire is provided between the sample and a shower head for diffusing gas fed through the gas flow inlet. The catalyst is heated to a high temperature by means of a catalyst heating mechanism for decomposing the fed gas. In this case, oxide can be removed through reduction with atomic hydrogen, and organic contaminant can be removed through formation of a hydrocarbon by reaction between atomic hydrogen and carbon. Atomic hydrogen or ammonia-decomposed species is generated through catalytic decomposition by means of the heated catalyst.

The aforementioned hydrogen-containing compound, serving as a raw material of atomic hydrogen or ammonia-decomposed species, may be a compound containing hydrogen and nitrogen, such as ammonia or hydrazine. In this case, when a gas of the compound is brought into contact with the heated catalyst, both atomic hydrogen and atomic nitrogen are generated. Therefore, reduction of a surface-oxidized metal film and/or removal of an organic substance is attained by atomic hydrogen, and nitridation of the surface of a metal is attained by atomic nitrogen.

The material of the catalyst may be, in addition to the aforementioned tungsten, any one of tantalum, molybdenum, vanadium, rhenium, platinum, thorium, zirconium, yttrium, hafnium, palladium, iridium, ruthenium, iron, nickel, chromium, aluminum, silicon, and carbon; or any one of oxides of these elements, nitrides of these elements, carbides of these elements (exclusive of carbon), oxides of a mixed crystal or compound containing two or more species selected from these elements, nitrides of a mixed crystal or compound containing two or more species selected from these elements, and carbides of a mixed crystal or compound containing two or more species selected from these elements (exclusive of carbon). When the catalyst is formed of, for example, tungsten, the temperature of the catalyst is appropriately regulated to fall within a range of 1,000° C. to 2,200° C.

Next will be described in detail the "insulating film formation method" which has been mentioned above with reference to FIGS. 4, 20, and 12. In the aforementioned example, the insulating film formation method has been described, while holes which penetrate through a semiconductor substrate are taken as example through holes. However, the insulating film formation method can be applied to holes employed for connecting upper and lower layers of a multi-layer wiring section. An insulating film formed on the surface (wall) defining such a through-hole preferably exhibits high thermal conductivity.

In a semiconductor wafer level implementation or semiconductor bare chip stacked structure, an insulating film provided, for example, around through-holes of a silicon substrate must be formed through deposition at low temperature. In the present invention, a nitride film is employed as an insulating film, and the film is formed by use of decomposed species generated through catalytic decomposition of a raw material on a heated catalyst.

Such an insulating film can be formed by means of a treatment apparatus similar to that described above with reference to FIG. 26, which serves as a copper wire cleaning apparatus. By means of such an apparatus, a nitride film serving as an insulating film can be formed on, for example, an inner wall defining a through-hole of a substrate (e.g., a silicon substrate) through which a through-electrode penetrates. Such a nitride film is formed on the inner wall of the through-hole of the substrate by bringing a raw material gas into contact with a heated catalyst, and bringing, into contact with the through-hole inner wall, chemical species generated through catalytic decomposition.

The nitride film serving as an insulating film is formed from any of silicon carbonitride, silicon oxynitride, silicon oxycarbonitride, and silicon nitride. In the case of thin film formation in the present invention, no practical problem arises even when x, y, or z of silicon carbonitride ($SiC_xN_y$), silicon oxynitride ($SiO_xN_y$), silicon oxycarbonitride ($SiO_xC_yN_z$), or silicon nitride ($SiN_x$) is shifted by several percent from the stoichiometric value, which would otherwise occur, for example, through substitution of an element (e.g., C, O, or N) with H under certain production conditions. However, preferably, x, y, and z of these compounds satisfy the following relations.

$SiC_xN_y$ [wherein x and y satisfy the following relations: $0<x<1$, $0<y<4/3$, and $4x+3y=4$]

$SiO_xN_y$ [wherein x and y satisfy the following relations: $0<x<2$, $0<y<1.4$, and $2x+3y=4$]

$SiO_xC_yN_z$ [wherein x, y, and z satisfy the following relations: $0<x<2$, $0<y<1$, $0<z<1.4$, and $2x+4y+3z=4$]

$SiN_x$ [wherein x satisfies the following relation: $0<x<1.4$]

A film formed from nitrogen-containing silicon nitride (i.e., silicon carbonitride ($SiC_xN_y$)), which exhibits high hardness, tends to undergo high stress, and thus is easily broken. However, an insulating film formed of silicon carbonitride film exhibits stress-reducing effect. In addition, such a silicon carbonitride film is advantageous in terms of low relative dielectric constant, and exhibits barrier property superior to that of silicon nitride film. Therefore, recently, attempts have been made to employ such a silicon carbonitride film as an undercoat film of a High-k insulating film of an LSI.

A raw material supply mechanism is provided for supplying a raw material for forming an SiN film through deposition (e.g., hexamethyldisilazane or silane). A vacuum system is provided for discharging gas remaining in the reaction chamber.

The insulating film is formed from a compound containing N and Si; specifically, one or more silazane-group-containing compounds selected from among hexamethyldisilazane, tetramethyldisilazane, octamethyltrisilazane, hexamethylcyclotrisilazane, tetraethyltetramethylcyclotetrasilazane, and tetraphenyldimethyldisilazane. Such a raw material is fed into the reaction chamber through a gas flow inlet provided on the top surface of the reaction chamber by means of the raw material supply mechanism. Although silane gas, which is generally explosive, may be difficult to handle in large-sized equipment, hexamethyldisilazane (HMDS) is particularly advantageous in that it is easily handled.

Figure 27:
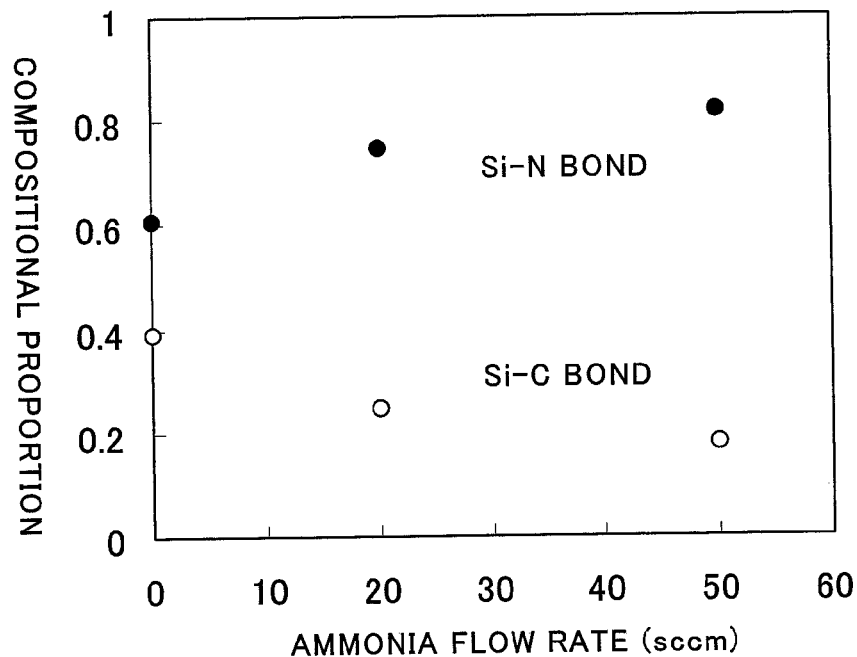
FIG. 27 shows the relation between the flow rate of ammonia and the composition of a formed thin film, the composition being represented by proportions of Si—C and Si—N bonds as determined through peak separation of an Si(2p) spectrum obtained by photoelectron spectroscopy.

FIG. 27 shows the relation between the flow rate of ammonia and the composition of a thin film formed through the aforementioned process, the composition being represented by proportions of Si—C and Si—N bonds as determined through peak separation of an Si(2p) spectrum obtained by photoelectron spectroscopy. The thin film was formed under the following conditions: catalyst temperature: 1,700° C., substrate temperature: 50° C. As is clear from FIG. 27, the number of Si—N bonds in the thin film, which is formed from SiCN, increases in accordance with an increase in ammonia flow rate.

Figure 28:
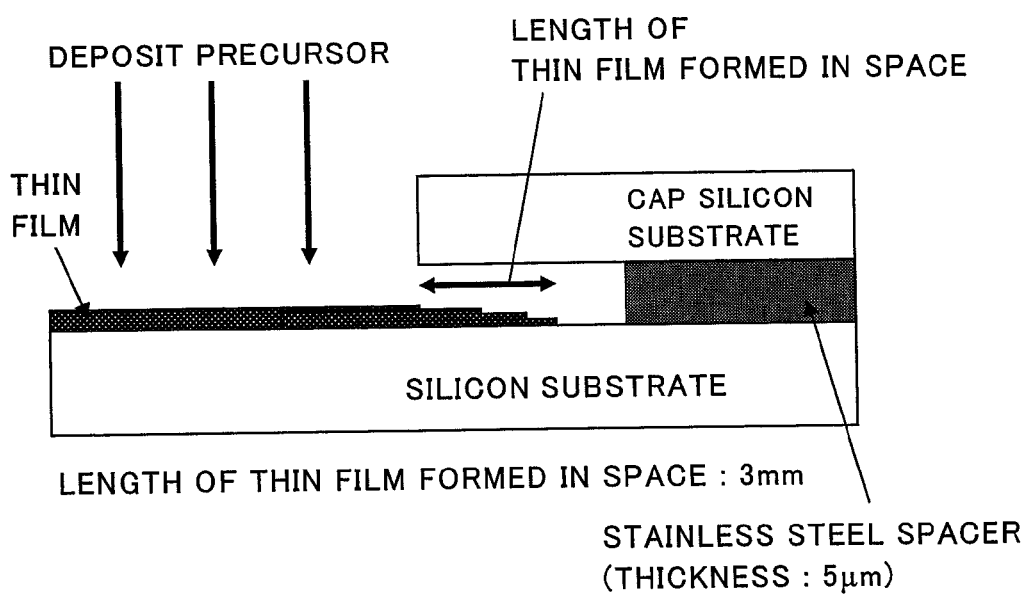
FIG. 28 is a schematic representation showing a setup for a test performed for evaluation of deposited film's ability to cover a step (i.e., step-covering ability).

FIG. 28 is a schematic representation showing a setup for a test performed for evaluation of film's ability to cover a step (hereinafter may be referred to as "step-covering ability"), the film being deposited through the aforementioned process. As shown in FIG. 28, a stainless steel spacer (thickness: 5 μm) was provided between a silicon substrate (thickness: 700 μm) and a cap silicon substrate (thickness: 700 μm), and the resultant structure was placed at a position at which species for thin film deposition can be provided from above. Thin film deposition was carried out under the conditions shown in FIG. 27 (ammonia flow rate: 50 sccm). Subsequently, the thickness of a thin film formed in a space provided by the spacer was measured by means of a film thickness meter, and the length of the thin film formed in the space was estimated. As a result, the length of the thin film formed in the space was found to be 3 mm as measured from the edge of the cap silicon substrate. This finding suggests that the aforementioned process can form a film exhibiting excellent step-covering ability.

After a nitride film is formed, and then through-electrodes are formed, as described above in detail, reduction of a surface-oxidized film and/or removal of an organic substance is carried out. Specifically, through-electrodes formed through charging of metal nanoparticles are treated with atomic hydrogen generated by bringing a gas of a hydrogen-containing compound into contact with a heated catalyst (i.e., catalytic decomposition). A silicon LSI wafer having a wiring pattern formed by use of copper nanoparticles is placed, as a sample (substrate), on the sample stage of the aforementioned copper wire cleaning apparatus. Subsequently, hydrogen gas is fed into the apparatus at a flow rate of 30 sccm for 10 minutes in order to remove contaminants from the silicon LSI wafer, which has the wiring pattern formed by use of copper nanoparticles.

In general, for the production of a semiconductor device, a semiconductor wafer of large area is provided, and unit circuits, each including a predetermined circuit element, are formed on the first main surface of the wafer. The unit circuits are aligned in vertical and horizontal directions on the first main surface of the wafer. Subsequently, the semiconductor wafer is subjected to the aforementioned various processes, including through-electrode formation, and insulating film formation. Finally, the resultant wafer is cut in vertical and horizontal directions, and then separated into numerous semiconductor devices (semiconductor chips). Solvent removal and resistance-reducing treatment after copper wiring formation are not necessarily performed on the semiconductor wafer, and are effectively performed during the course of wiring on a package board of a unit semiconductor chip obtained through the aforementioned cutting and separation.

The invention claimed is:

1. A packaged stacked semiconductor device which comprises bumps serving as external electrode terminals, the bumps being provided on both a front surface and a back surface of the device, and which is stacked on another semiconductor device, substrate, or board having electrode terminals so that the bumps are directly and electrically connected to the electrode terminals, comprising:

a semiconductor substrate having through-electrodes which penetrate through the substrate;

on the front surface side of the semiconductor substrate, an LSI formation surface on which a plurality of circuit elements are formed, a multi-layer wiring section provided on the LSI formation surface and connected to the circuit elements, a first insulating film provided on the top surface of the multi-layer wiring section, an additional wiring layer provided on the first insulating film for connecting a final wiring layer of the multi-layer wiring section to the through-electrodes and/or post electrodes, a second insulating film formed so as to cover the front surface of the semiconductor substrate, exclusive of tip end surfaces of the post electrodes, and external connection bumps connected to the tip end surfaces of the post electrodes, wherein the second insulating film has a thickness greater than that of the semiconductor substrate, and rigidity of the semiconductor device is substantially secured by the second insulating film; and on the back surface side of the semiconductor substrate, a third insulating film formed so that tip end surfaces of the through-electrodes are exposed, bump formation regions which are provided on the third insulating film and are connected to the tip end surfaces of the through-electrodes by means of wiring, a fourth insulating film formed on the third insulating film, and external connection bumps connected to the bump formation regions through apertures provided in the fourth insulating film.

2. A packaged stacked semiconductor device according to claim 1, wherein the wiring on the third insulating film is formed through screen printing or ink jetting by use of metal nanoparticles.

3. A packaged stacked semiconductor device according to claim 2, wherein the wiring is covered with a nitride film, and the nitride film is formed from any of silicon carbonitride, silicon oxynitride, silicon oxycarbonitride, and silicon nitride, which are chemical species generated through catalytic decomposition caused by bringing, into contact with a heated catalyst, one or more silazane compounds selected from among hexamethyldisilazane, tetramethyldisilazane, octamethyltrisilazane, hexamethylcyclotrisilazane, tetraethyltetramethylcyclotetrasilazane, and tetraphenyldimethyldisilazane.

4. A packaged stacked semiconductor device according to claim 1, in which the stacked semiconductor device carries, on its top surface, an additional semiconductor device, and is mounted on and connected to the top surface of a daughterboard formed of a multi-layer wiring board, wherein the stacked semiconductor device is aligned with the additional semiconductor device so that connection regions of these devices are overlapped with one another, and the external connection bumps are connected to the additional semiconductor device.

5. A packaged stacked semiconductor device according to claim 4, which includes a spacer via which a peripheral portion of the additional semiconductor device is supported by the daughterboard.

6. A packaged stacked semiconductor device according to claim 4, which is connected to one or more additional semiconductor devices in three dimensions with a substrate or a heat radiation plate being inserted between the stacked semiconductor device and the additional semiconductor device(s).

7. A packaged stacked semiconductor device according to claim 1, wherein the second insulating film has a thickness of 40 to 200 mm, the semiconductor substrate has a thickness of 10 to 50 mm, and the fourth insulating film has a thickness of 30 mm or less.

8. A packaged stacked semiconductor device according to claim 1, wherein, on the back surface of the semiconductor substrate, the bump formation regions connected, by the wiring, to the tip end surfaces of the through-electrodes are relocated by means of an additional wiring layer to arbitrary positions with respect to the positions of the through-electrodes.

9. A packaged stacked semiconductor device according to claim 1, in which simultaneously with formation of holes for the through-electrodes in a plurality of the semiconductor substrates, which are portions of a semiconductor wafer arranged in a grid pattern, scribe lines of a predetermined with for cutting the semiconductor wafer into individual semiconductor devices are formed on the semiconductor wafer; and the second insulating film is formed so as to cover the front surface of the substrate and the scribe lines, so that each of the semiconductor devices obtained through cutting along the scribe lines has end surfaces covered with the insulating film.

10. A packaged stacked semiconductor device according to claim 1, wherein the first and second insulating films are formed on the semiconductor substrate in the form of semiconductor wafer, and the wiring on the back surface of the semiconductor substrate is formed through ink jetting by use of copper nanoparticles.

11. A packaged stacked semiconductor device according to claim 1, wherein a nitride film is employed as an insulating film which covers the side walls of the holes for the through-electrodes, and the nitride film is formed on the side walls by bringing, into contact with the side walls, any of silicon carbonitride, silicon oxynitride, silicon oxycarbonitride, and silicon nitride, which are chemical species generated through catalytic decomposition caused by bringing, into contact with a heated catalyst, one or more silazane compounds selected from among hexamethyldisilazane, tetramethyldisilazane, octamethyltrisilazane, hexamethylcyclotrisilazane, tetraethyltetramethylcyclotetrasilazane, and tetraphenyldimethyldisilazane.

12. A packaged stacked semiconductor device according to claim 11, wherein the through-electrodes are formed by charging metal nanoparticles in the holes covered with the insulating film.

13. A packaged stacked semiconductor device according to claim 12, wherein the through-electrodes are treated with atomic hydrogen generated through catalytic decomposition caused by bringing a gas of a hydrogen-containing compound into contact with a heated catalyst, for reduction of a surface-oxidized film and/or removal of an organic substance.

14. A method for producing a packaged stacked semiconductor device which comprises bumps serving as external electrode terminals, the bumps being provided on both a front surface and a back surface of the device, and which is stacked on another semiconductor device, substrate, or board having electrode terminals so that the bumps are directly and electrically connected to the electrode terminals, comprising:

providing a plurality of semiconductor substrates, which are portions of a semiconductor wafer arranged in a grid pattern formed by scribe lines;

forming a plurality of circuit elements on the front surface of each semiconductor substrate, the front surface serving as an LSI formation surface;

forming a multi-layer wiring section on the LSI formation surface so that the section is connected to the circuit elements;

providing through-electrodes in the semiconductor substrate;

forming a first insulating film on the multi-layer wiring section;

forming an additional wiring layer for connecting a final wiring layer of the multi-layer wiring section to the through-electrodes and/or post electrodes;

forming a second insulating film on the front surface of the semiconductor substrate, after formation of the post electrodes, and exposing tip end portions of the post electrodes;

grinding the back surface of the semiconductor substrate so that tip end portions of the through-electrodes are exposed;

forming a third insulating film on the back surface of the semiconductor substrate so that tip end surfaces of the through-electrodes are exposed;

providing bump formation regions on the third insulating film formed on the back surface of the semiconductor substrate so that the bump formation regions are connected to the thus-exposed tip end surfaces of the through-electrodes by means of wiring;

forming a fourth insulating film on the wiring;

forming bumps on the bump formation regions through apertures provided in the fourth insulating film, wherein the second insulating film is formed to have a thickness greater than that of the semiconductor substrate, and the fourth insulating film is formed to have a thickness smaller than that of the substrate, so that rigidity of the semiconductor device is substantially secured by the second insulating film; and forming bumps on the tip end portions of the post electrodes on the front side of the semiconductor substrate.

15. A packaged stacked semiconductor device production method according to claim 14, wherein the wiring on the third insulating film on the back surface of the semiconductor substrate is formed through screen printing or ink jetting by use of metal nanoparticles.

16. A packaged stacked semiconductor device production method according to claim 15, wherein the wiring is covered with a nitride film, and the nitride film is formed from any of silicon carbonitride, silicon oxynitride, silicon oxycarbonitride, and silicon nitride, which are chemical species generated through catalytic decomposition caused by bringing, into contact with a heated catalyst, one or more silazane compounds selected from among hexamethyldisilazane, tetramethyldisilazane, octamethyltrisilazane, hexamethylcyclotrisilazane, tetraethyltetramethylcyclotetrasilazane, and tetraphenyldimethyldisilazane.

17. A packaged stacked semiconductor device production method according to claim 14, wherein formation of the bumps on the front and back sides of the semiconductor substrate is carried out before or after the semiconductor wafer is cut and separated into individual semiconductor devices.

18. A packaged stacked semiconductor device production method according to claim 14, wherein formation of the through-electrodes, which penetrate through the semiconductor substrate, is carried out through a process in which holes for the through-electrodes are provided in the substrate; an insulating film is formed on the side walls of the holes at such a low temperature that does not adversely affect the multi-layer wiring section; material for the through-electrodes is charged into the holes; and the through-electrodes are connected to a predetermined wiring layer in the multi-layer wiring section.

19. A packaged stacked semiconductor device production method according to claim 14, wherein formation of the through-electrodes, which penetrate through the semiconductor substrate, is carried out through a process in which holes for the through-electrodes are provided in the substrate; an insulating film is formed on the side walls of the holes at such a low temperature that does not adversely affect the multi-layer wiring section; an aperture is formed in the multi-layer wiring section to thereby provide a portion for connecting the through-electrodes to a predetermined wiring layer in the multi-layer wiring section; and material for the through-electrodes is charged into the holes and the aperture serving as the connection portion.

20. A packaged stacked semiconductor device production method according to claim 14, wherein holes for the through-electrodes are provided in the semiconductor substrate in the form of semiconductor wafer on which numerous semiconductor elements of the same type have been simultaneously formed, while scribe lines having a predetermined width for cutting the semiconductor substrate into individual semiconductor devices are formed on the substrate; and the second insulating film is formed so as to cover the front surface of the semiconductor substrate and the scribe lines, so that a semiconductor device obtained through cutting along the scribe lines has end surfaces covered with the insulating film.

21. A packaged stacked semiconductor device production method according to claim 14, wherein the first and second insulating films are formed on the semiconductor substrate in the form of semiconductor wafer, and the wiring on the back surface of the semiconductor substrate is formed through ink jetting by use of copper nanoparticles.

22. A packaged stacked semiconductor device production method according to claim 14, wherein a nitride film is employed as an insulating film which covers the side walls of the holes for the through-electrodes, and the nitride film is formed on the side walls by bringing, into contact with the side walls, any of silicon carbonitride, silicon oxynitride, silicon oxycarbonitride, and silicon nitride, which are chemical species generated through catalytic decomposition caused by bringing, into contact with a heated catalyst, one or more silazane compounds selected from among hexamethyldisilazane, tetramethyldisilazane, octamethyltrisilazane, hexamethylcyclotrisilazane, tetraethyltetramethylcyclotetrasilazane, and tetraphenyldimethyldisilazane.

23. A packaged stacked semiconductor device production method according to claim 22, wherein the through-electrodes are formed by charging metal nanoparticles in the holes covered with the insulating film.

24. A packaged stacked semiconductor device production method according to claim 23, wherein the through-electrodes are treated with atomic hydrogen generated through catalytic decomposition caused by bringing a gas of a hydrogen-containing compound into contact with a heated catalyst, to thereby reduce a surface-oxidized film and/or to remove an organic substance.

* * * * *